US011127467B1

(12) United States Patent
Wang et al.

(10) Patent No.: US 11,127,467 B1
(45) Date of Patent: Sep. 21, 2021

(54) HYBRID ERASE MODE FOR HIGH DATA RETENTION IN MEMORY DEVICE

(71) Applicant: Western Digital Technologies, Inc., San Jose, CA (US)

(72) Inventors: Ming Wang, Shanghai (CN); Liang Li, Shanghai (CN); Jun Wan, San Jose, CA (US)

(73) Assignee: Western Digital Technologies, Inc., San Jose, CA (US)

(*) Notice: Subject to any disclaimer, the term of this patent is extended or adjusted under 35 U.S.C. 154(b) by 0 days.

(21) Appl. No.: 16/906,497

(22) Filed: Jun. 19, 2020

(51) Int. Cl.
G11C 16/04 (2006.01)
G11C 16/14 (2006.01)
G11C 16/34 (2006.01)
H01L 27/11565 (2017.01)
H01L 27/11582 (2017.01)

(52) U.S. Cl.
CPC .......... G11C 16/14 (2013.01); G11C 16/0483 (2013.01); G11C 16/3445 (2013.01); H01L 27/11565 (2013.01); H01L 27/11582 (2013.01)

(58) Field of Classification Search
CPC .................. G11C 16/0483; G11C 16/3454
USPC ....................................... 365/185.02, 185.22
See application file for complete search history.

(56) References Cited

U.S. PATENT DOCUMENTS

| 7,403,428 | B2 | 7/2008 | Higashitani |
| 7,606,100 | B2 | 10/2009 | Hemink et al. |
| 7,768,826 | B2 | 8/2010 | Ito |
| 9,070,474 | B2 | 6/2015 | Izumi |
| 9,224,494 | B2 | 12/2015 | Chin et al. |
| 10,381,095 | B1* | 8/2019 | Date ................. G11C 16/0483 |
| 11,043,280 | B1 | 6/2021 | Prakash et al. |
| 2009/0129165 | A1 | 5/2009 | Lee et al. |
| 2012/0243330 | A1 | 9/2012 | Yamano et al. |
| 2015/0003162 | A1 | 1/2015 | Mui et al. |
| 2015/0117114 | A1 | 4/2015 | Wan et al. |
| 2016/0027504 | A1 | 1/2016 | Lee |
| 2020/0111535 | A1 | 4/2020 | Han et al. |
| 2020/0365211 | A1 | 11/2020 | Nam et al. |
| 2020/0388342 | A1 | 12/2020 | Yang et al. |
| 2021/0191636 | A1 | 6/2021 | Ji et al. |

(Continued)

OTHER PUBLICATIONS

U.S. Appl. No. 16/906,516, filed Jun. 19, 2020.

(Continued)

*Primary Examiner* — Jason Lappas
(74) *Attorney, Agent, or Firm* — Vierra Magen Marcus LLP

(57) ABSTRACT

Apparatuses and techniques are described for performing an erase operation for a set of memory cells, where the erase operation includes an all word line erase phase to save time followed by an odd-even word line erase phase to improve data retention. A transition to the odd-even word line erase phase can be triggered when the memory cells pass a first verify test which indicates that the threshold voltages of the memory cells have decreased below a first voltage. Or, the transition can be triggered when a threshold number of erase-verify iterations have been performed. The erase operation may be completed when the memory cells pass a second verify test which indicates that the threshold voltages of the memory cells have decreased below a second voltage which is less than the first voltage.

20 Claims, 17 Drawing Sheets

(56) References Cited

U.S. PATENT DOCUMENTS

2021/0193238 A1  6/2021  Chai

OTHER PUBLICATIONS

International Search Report & The Written Opinion of the International Searching Authority dated Apr. 8, 2021, International Application No. PCT/US2021/018002.
Non-final Office Action dated Jun. 30, 2021, U.S. Appl. No. 16/906,516, filed Jun. 19, 2020.
Response to Office Action dated Jul. 14, 2021, U.S. Appl. No. 16/906,516, filed Jun. 19, 2020.

* cited by examiner

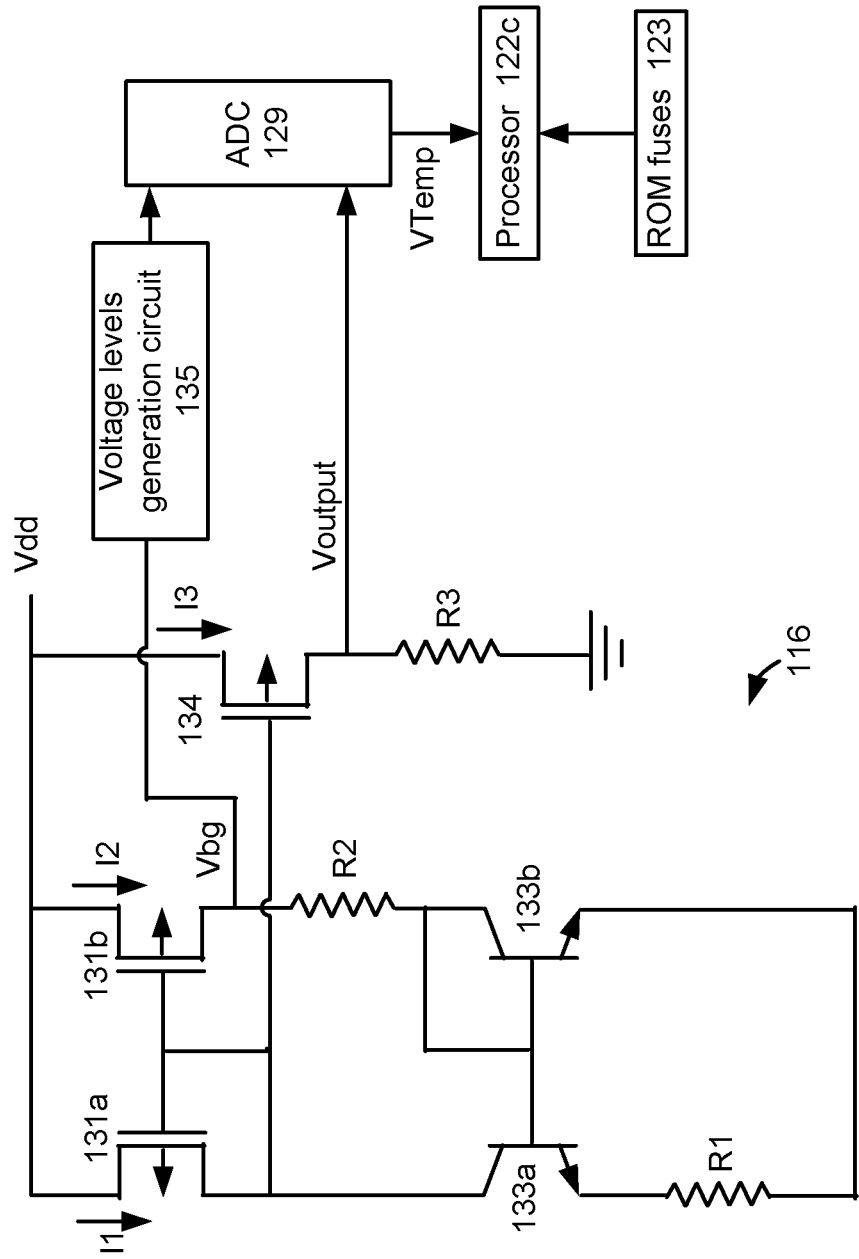

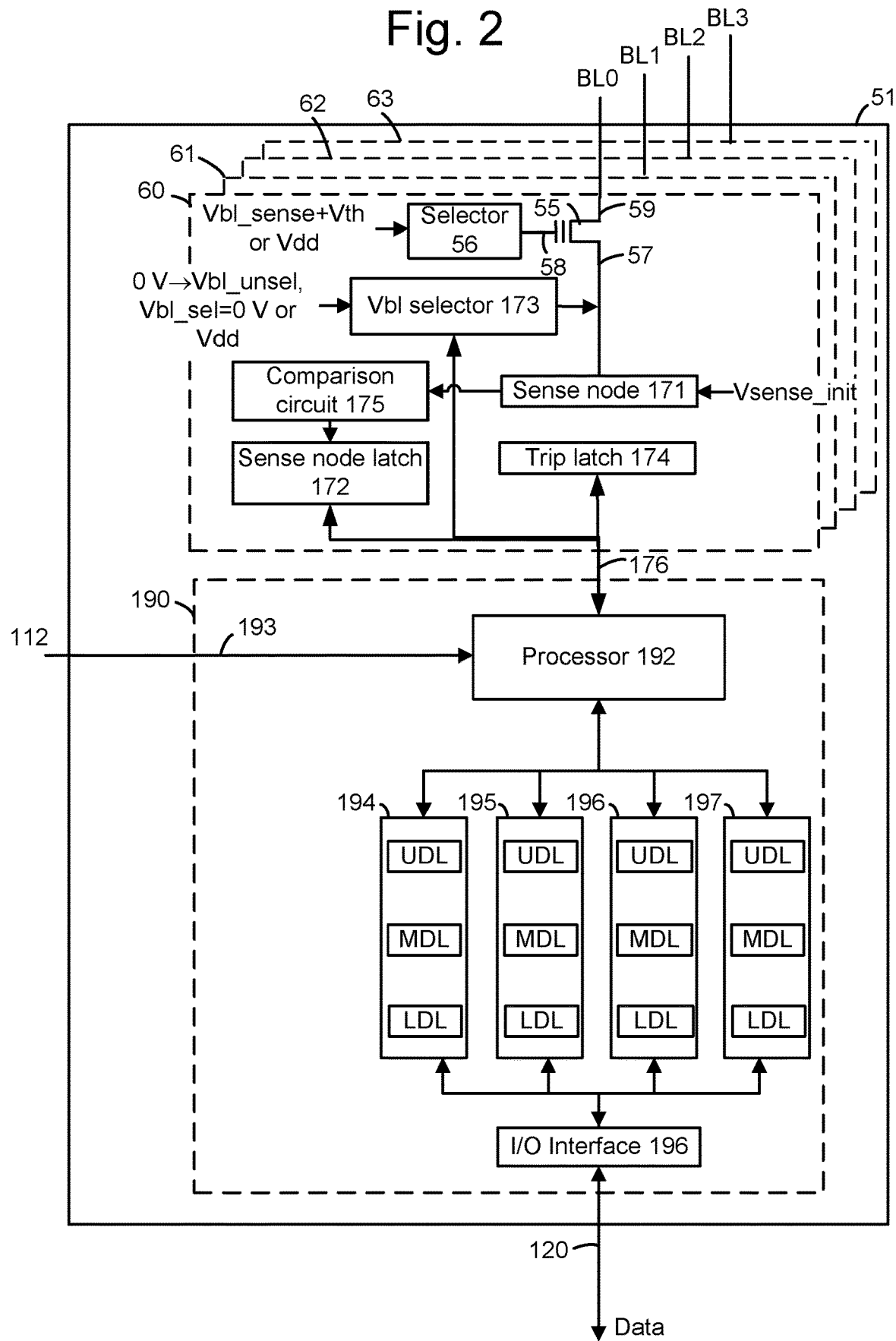

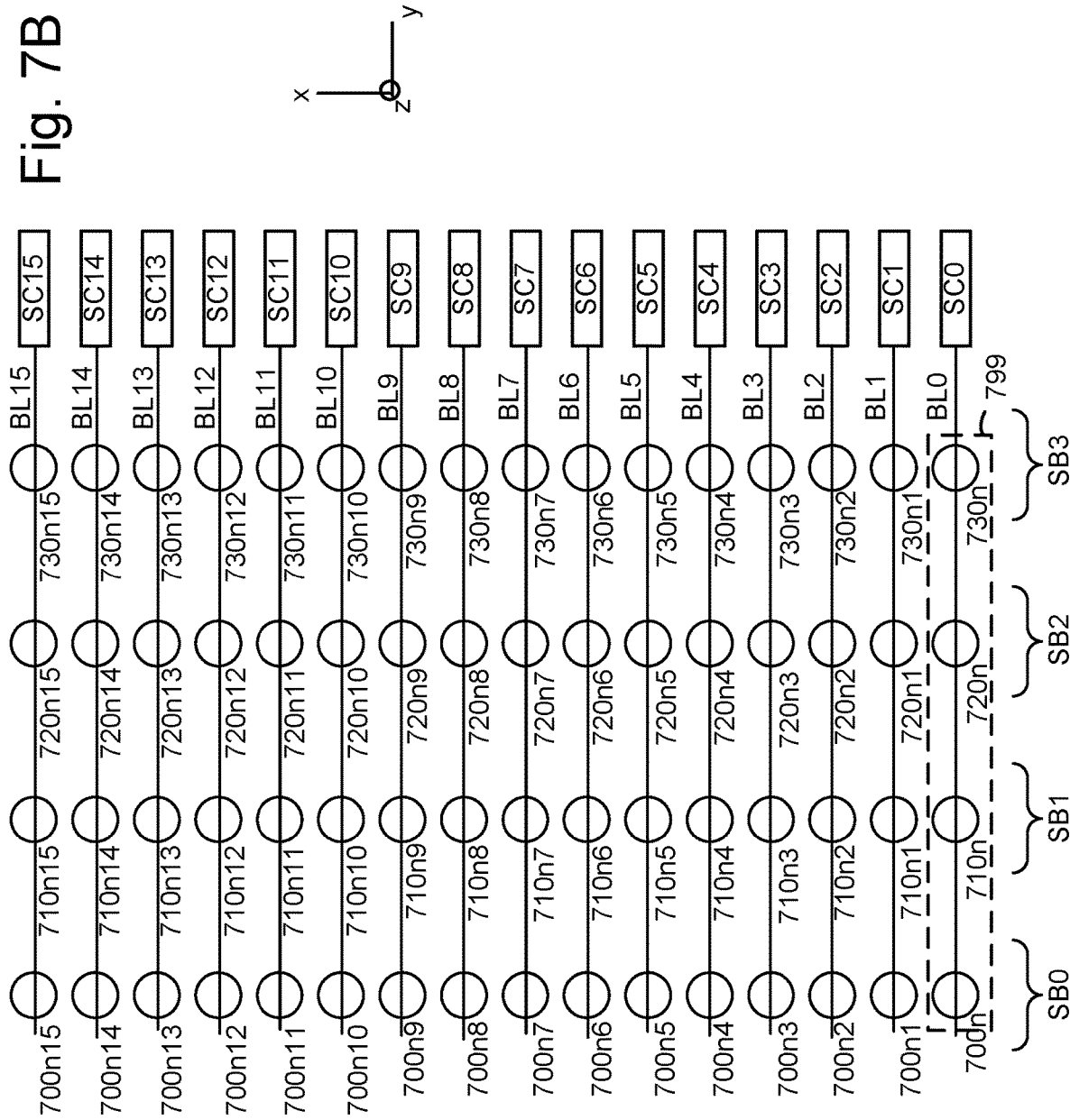

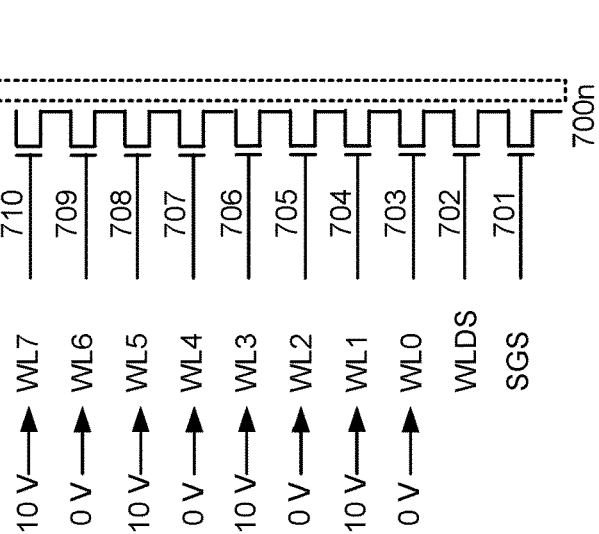
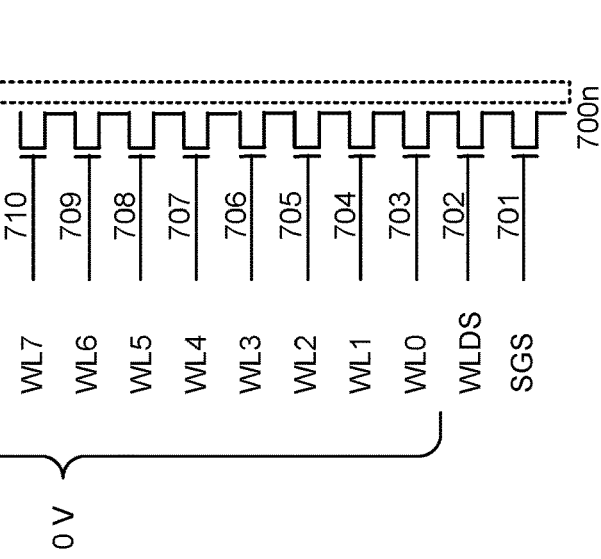
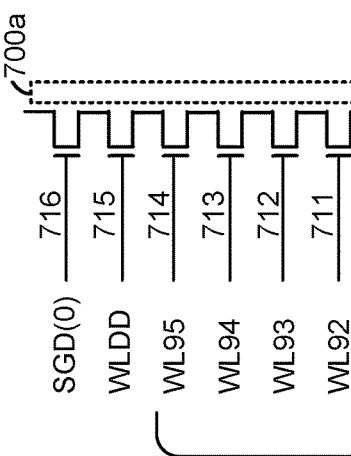

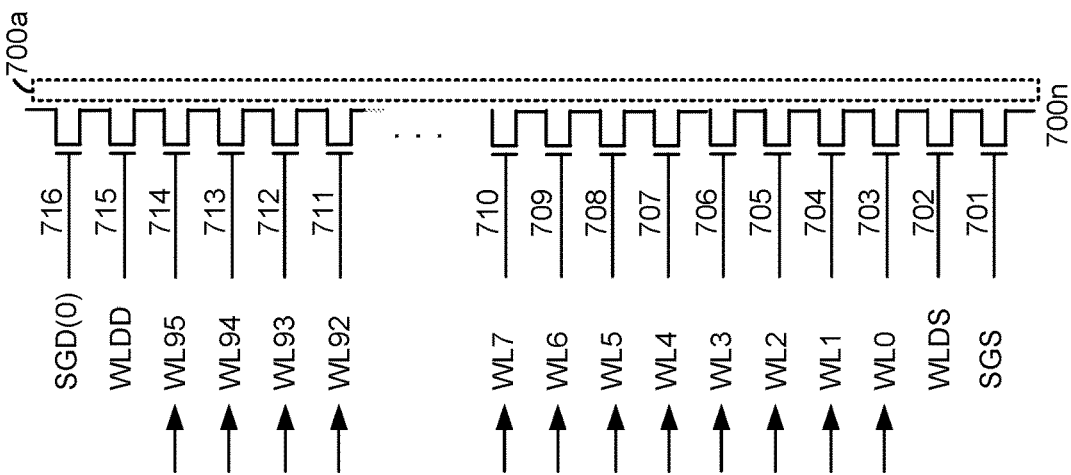
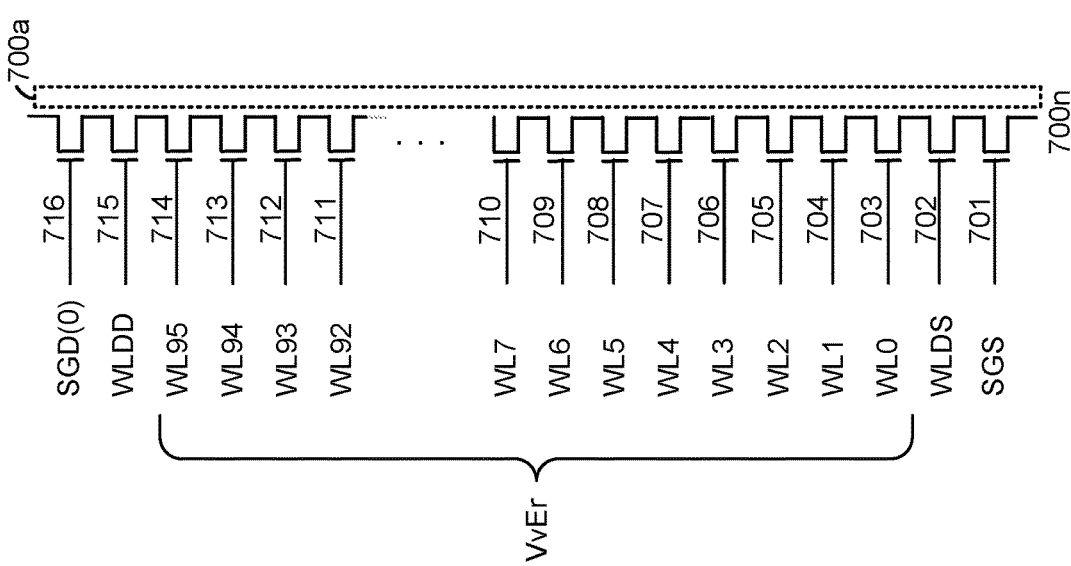
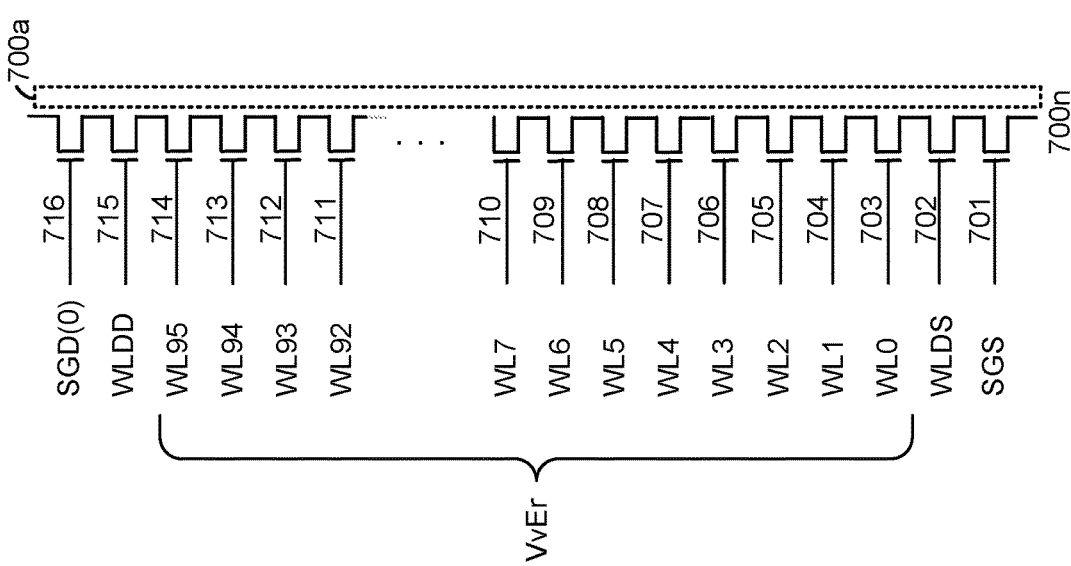

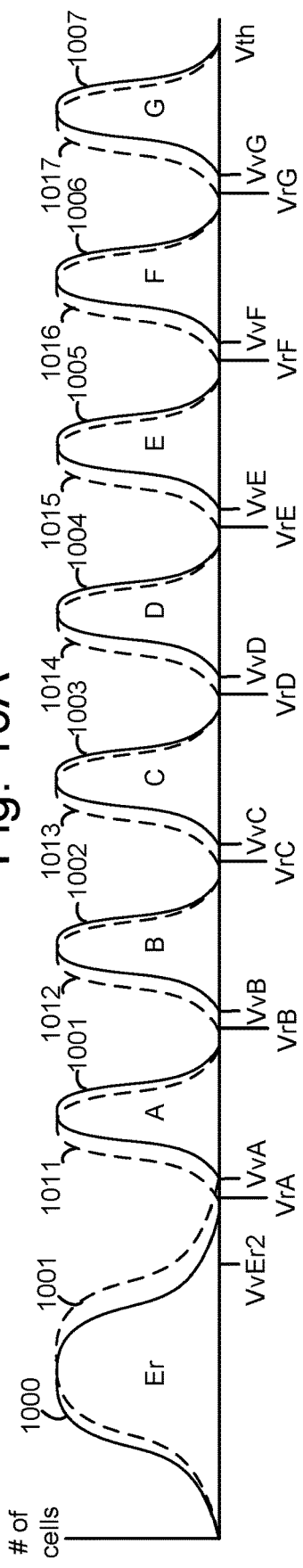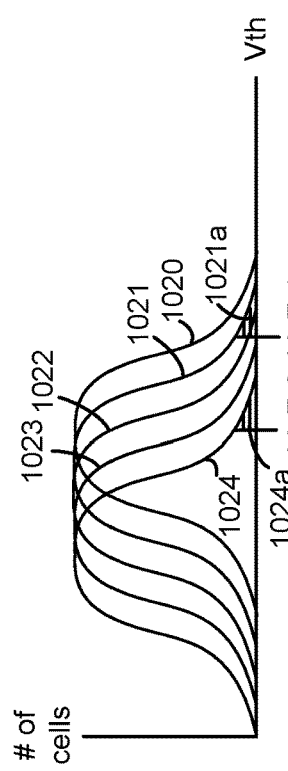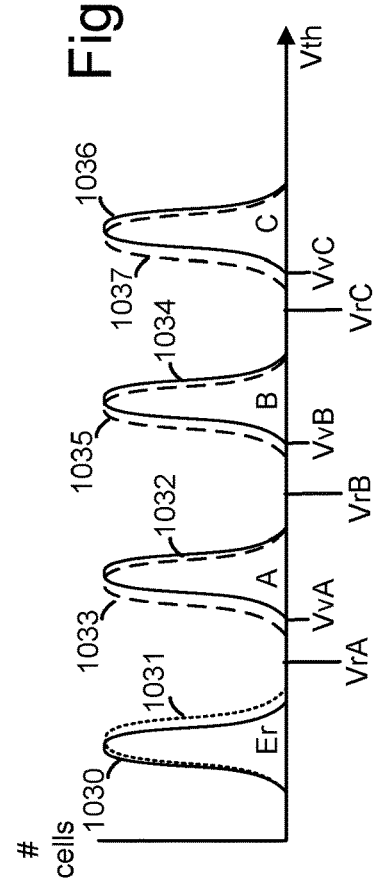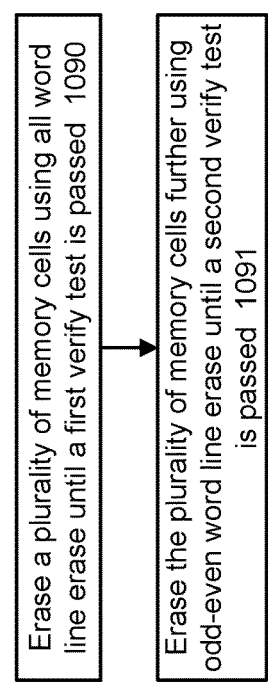

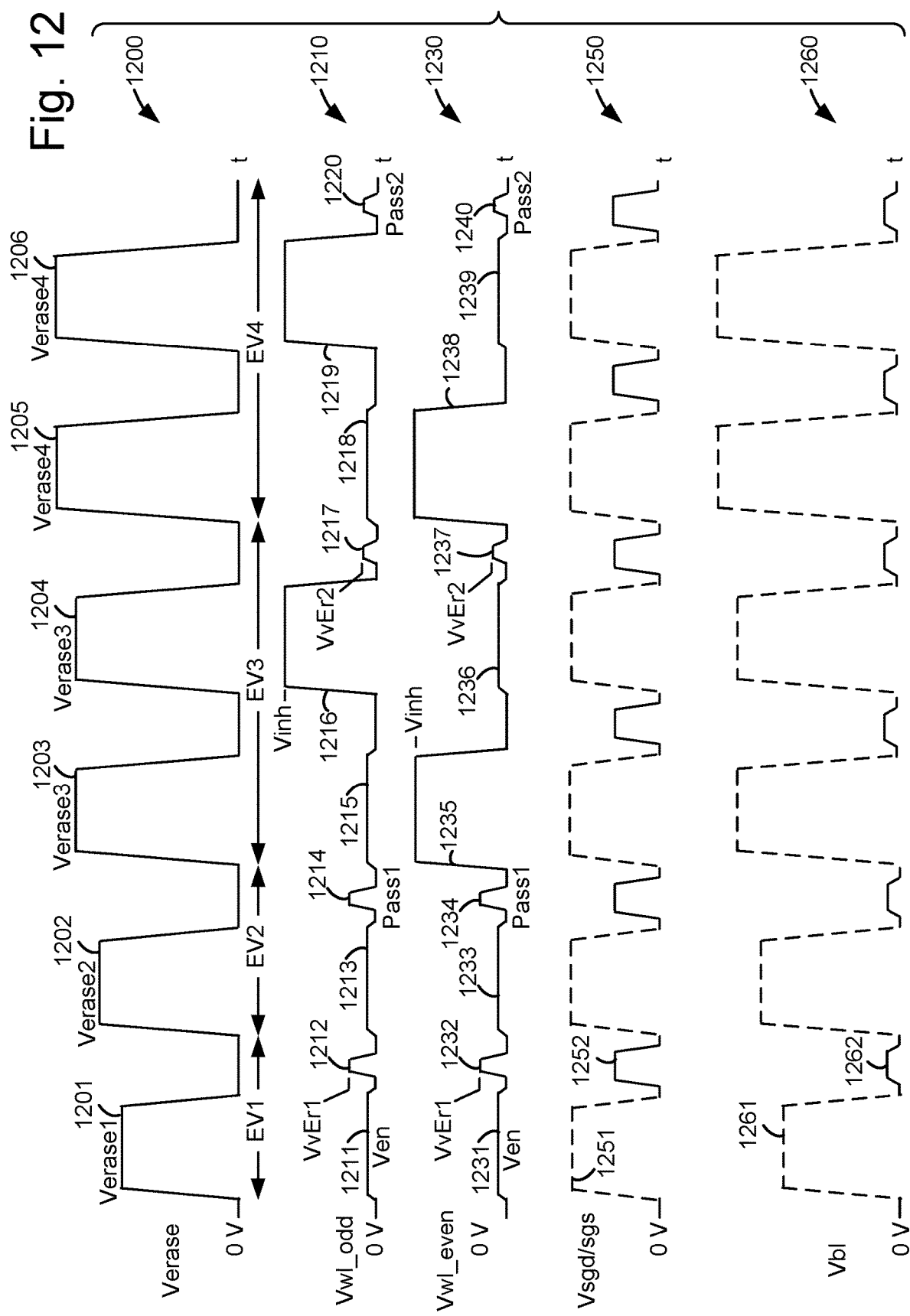

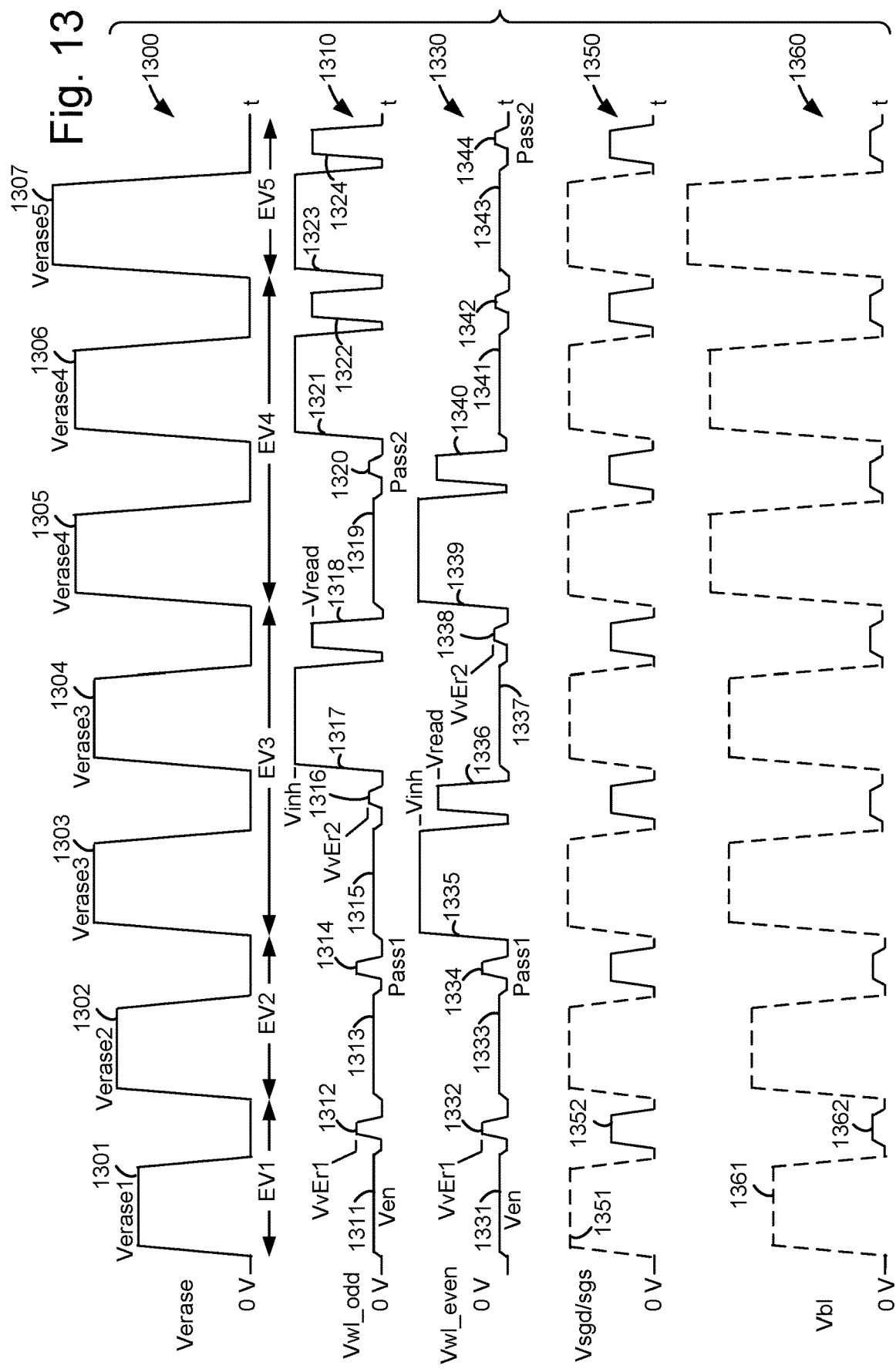

US 11,127,467 B1

HYBRID ERASE MODE FOR HIGH DATA RETENTION IN MEMORY DEVICE

CROSS-REFERENCE TO RELATED APPLICATIONS

This application is related to co-pending U.S. patent application Ser. No. 16/906,516 to Wang et al., titled "Command Sequence For Hybrid Erase Mode For High Data Retention In Memory Device" and filed herewith on Jun. 19, 2020.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1C depicts an example of the temperature-sensing circuit 116 of FIG. 1A.

FIG. 2 is a block diagram depicting one embodiment of the sense block 51 of FIG. 1A.

FIG. 7B depicts an example top view of the block B0-0 of FIG. 7A, with respective NAND strings, bit lines and sense circuits.

FIG. 8A depicts word line voltages in an all word line erase process, consistent with the NAND string 700n of FIG. 7A.

FIG. 8B depicts word line voltages in an odd-numbered word line erase process, consistent with the NAND string 700n of FIG. 7A.

FIG. 8C depicts word line voltages in an even-numbered word line erase process, consistent with the NAND string 700n of FIG. 7A.

FIG. 8D depicts word line voltages in an all word line verify process, consistent with the NAND string 700n of FIG. 7A.

FIG. 8E depicts word line voltages in an odd-numbered word line verify process, consistent with the NAND string 700n of FIG. 7A.

FIG. 8F depicts word line voltages in an even-numbered word line verify process, consistent with the NAND string 700n of FIG. 7A.

FIG. 10A depicts threshold voltage (Vth) distributions for an eight-state memory device.

FIG. 10B depicts example Vth distributions in an erase operation.

FIG. 10C depicts threshold voltage (Vth) distributions for a four-state memory device.

FIG. 11A depicts a flowchart of an example erase operation.

FIG. 12 depicts example waveforms in an erase operation consistent with FIGS. 11B and 11C.

FIG. 13 depicts example waveforms in an erase operation consistent with FIGS. 11B and 11D.

DETAILED DESCRIPTION

Figure 1A:
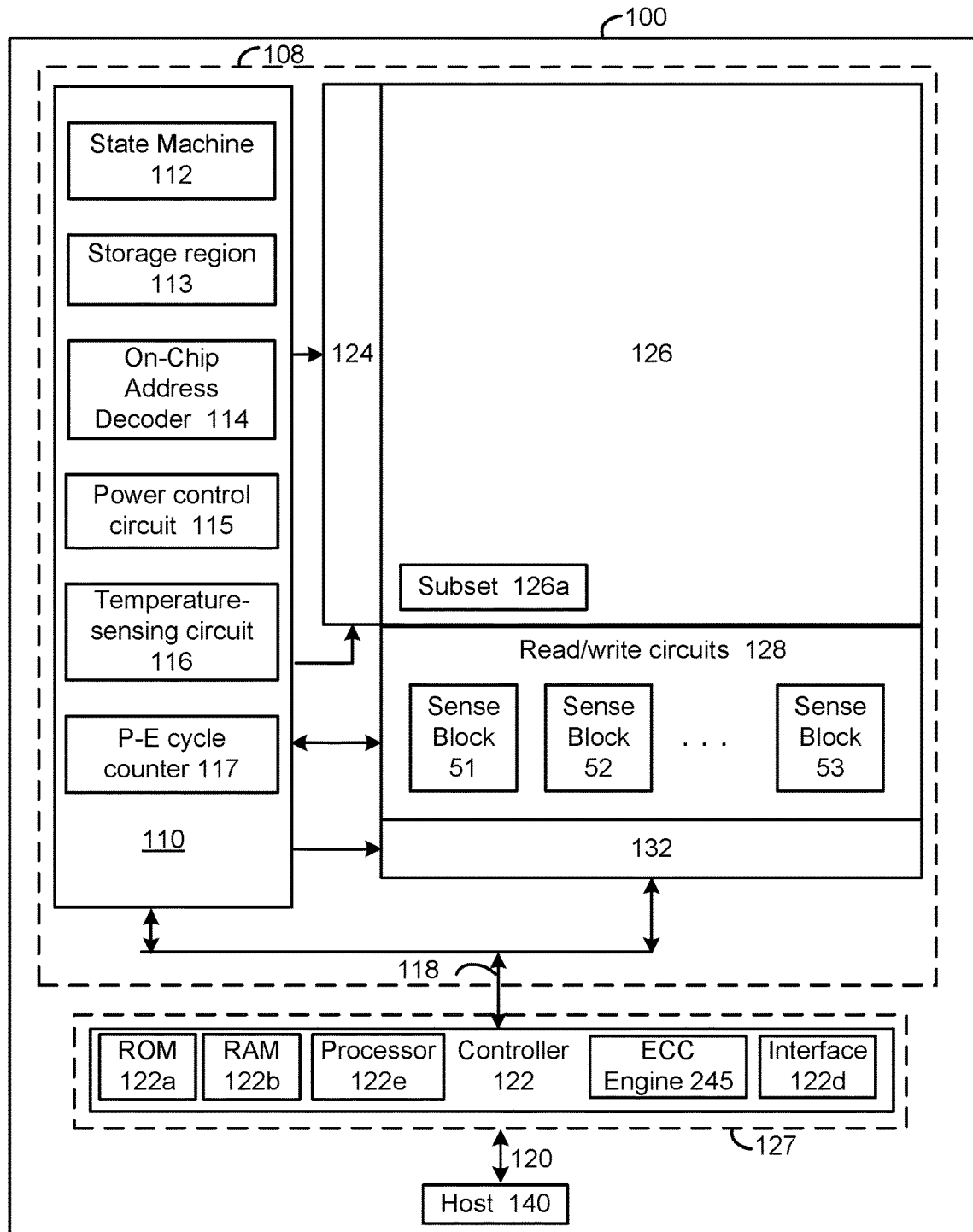
FIG. 1A is a block diagram of an example memory device.

Apparatuses and techniques are described for performing an erase operation for a set of memory cells, where the erase operation includes an all word line erase phase to save time followed by an odd-even word line erase phase to improve data retention.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. For example, see FIG. 7A. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extends vertically in the stack. For example, see the channel 660 and charge-trapping layer 664 in the NAND string 700n in FIG. 6. A source end 700s of the NAND string is connected to the substrate 611 and a drain end 700d of the NAND string is connected to a bit line, BL0. For example, see FIG. 6.

In a 2D memory structure, the memory cells may be arranged in horizontal NAND strings on a substrate.

An erase operation for memory cells in a block typically involves one or more erase-verify iterations, also referred to as erase loops, where each iteration involves one or more instances of channel boosting followed by a verify test, until the erase operation is completed. In each erase-verify iteration, the voltages of the channels are boosted while holding the voltages of the word lines at a low level, e.g., at or close to 0 V. The channels are boosted by applying one or more erase pulses to the block. See the voltage signals of FIGS. 12 and 13. In one approach, the erase pulse is applied to the substrate, causing holes to be injected into the channels via the source ends of the NAND strings. In another approach, the channels are boosted by generating holes at the source end and/or drain end of the NAND strings using gate-induced drain leakage (GIDL). This involves providing a strong back bias of the SGS and/or SGD transistors, respectively.

The boosting of the channels creates a large channel-to-gate voltage which drives holes into the charge trapping layers, lowering the threshold voltage (Vth) of the memory cells. A verify test, which is a sensing operation, can be performed after the application of the erase pulse to determine if the Vth of the memory cells has been lowered below a verify voltage. A verify test typically tests the erase level of a set of NAND strings by sensing a current in the set of NAND strings, as discussed, e.g., in connection with FIG. 7B. The erase operation is completed when the verify test is passed by all or nearly all of the sets of NAND strings.

An erase operation can use two types of erase modes. In one approach, referred to as all word line erase (FIG. 8A), the memory cells connected to each of the word lines in a block, for instance, are erased concurrently in an erase-verify iteration. All word line erase is typically followed by an all word line verify (FIG. 8D), where the memory cells connected to each of the word lines are subject to a verify test concurrently in the erase-verify iteration. This approach is efficient since the concurrent erasing and verifying consume a minimal amount of time. However, with all word line erase, data retention of the memory cells can be impaired due to the accumulation of holes in the charge trapping layers of the NAND strings, between the word lines. See 9A. This is referred to as inter-word line hole accumulation. It results in lateral movement of electrons in the charge trapping layers after programming. The problem becomes worse as memory cells are erased to a lower Vth to achieve more Vth budget (e.g., more spacing between Vth distributions of adjacent data states). The problem is worse also in 3D NAND where the charge trapping layer is monolithic.

In another approach, referred to as all odd-even word line erase (or stripe word line erase or alternate word line erase), the memory cells connected to the odd-numbered word lines are erased separately from the memory cells connected to the even-numbered word lines. See also FIGS. 8B and 8C. The verify tests can be performed in two different ways, for example, with the odd-even word line erase. In the first way, the memory cells connected to each of the word lines are subject to a verify test concurrently in the erase-verify iteration. See also FIG. 8D. In another way, the memory cells connected to the odd-numbered word lines are subject to a verify test separately from the memory cells connected to the even-numbered word lines. See also FIGS. 8E and 8F. The odd-even word line erase reduces the accumulation of holes in the charge trapping layers of the NAND strings between the word lines. See also FIG. 9C-9E. However, there is a time penalty due to the separate erasing of the odd and even word lines.

Techniques provided herein address the above and other issues. In one aspect, an erase operation performs an all word line erase phase followed by an odd-even word line erase phase. A transition from the all word line erase phase to the odd-even word line erase phase can be triggered when the memory cells pass a first verify test which indicates that the threshold voltages of the memory cells have decreased below a first voltage. Or, the transition can be triggered when a threshold number of erase-verify iterations have been performed. A second verify test may be performed instead of the first verify test in the odd-even word line erase phase. Moreover, the erase operation may be completed when the memory cells pass the second verify test which indicates that the threshold voltages of the memory cells have decreased below a second voltage which is less than the first voltage.

During the erase operation, an erase voltage may be applied to charge up the channels of the NAND strings, where the erase voltage increases over the erase-verify iterations. For example, the erase voltage can step up in each erase-verify iteration after the initial erase-verify iteration of the erase operation. By performing the all word line erase while the erase voltage is relatively low, the erase time is minimized when the risk of inter-word line hole accumulation is low, since this risk is relatively low when the erase voltage and therefore the channel voltage are relatively low. Moreover, by performing the odd-even word line erase while the erase voltage is relatively high, the risk of inter-word line hole accumulation is reduced compared to the case when all word line erased is used. There is a tradeoff in that more time is used in the odd-even word line erase compared to the all word line erase. However, the combination of erase time and risk of inter-word line hole accumulation is optimized.

The transition to the odd-even word line erase can be optimized based on factors such as temperature, number of program-erase cycles, number of data states which will be programmed in the memory cells, and sub-block position when the sub-blocks of a block are verified separately in the erase operation.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, ... 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control circuit 115, a temperature-sensing circuit 116, and a program-erase (P-E) cycle counter 117. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 116 can detect a temperature of the memory device during the lifetime of the memory device, e.g., every minute.

The P-E cycle counter 117 can track the number of P-E cycles for each block or other set of memory cells in the memory device. The number of P-E cycles can be used to adjust a verify voltage in a verify test, as discussed further below.

The circuits 116 and 117 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, temperature-sensing circuit 116, P-E cycle counter 117, sense blocks 51, 52, ..., 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
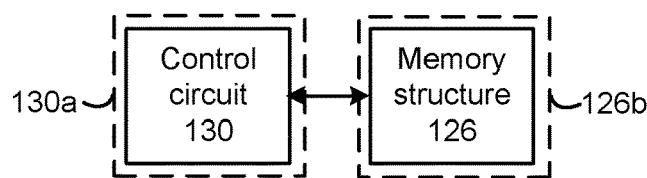
FIG. 1B is a block diagram of an arrangement of the memory device 100 of FIG. 1A in which a control circuit 130 on a first die 130a communicates with the memory structure 126 on a separate second die 126b.

FIG. 1B is a block diagram of an arrangement of the memory device 100 of FIG. 1A in which a control circuit 130 on a first die 130a communicates with the memory structure 126 on a separate second die 126b. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on one die while the plurality of memory cells are on another die.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114, power control circuit 115, temperature-sensing circuit 116 and P-E cycle counter 117. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 1C depicts an example of the temperature-sensing circuit 116 of FIG. 1A. The circuit includes pMOSFETs 131a, 131b and 134, bipolar transistors 133a and 133b and resistors R1, R2 and R3, I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122e. This is data indicating a temperature of the memory device. ROM fuses 123 store data which correlates the matching voltage level to a temperature, in one approach. The processor then uses the temperature to set temperature-based parameters in the memory device such as by using the comparison circuit.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line and NAND string, and a common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 1 V, is the threshold voltage of the transistor 55. This assumes the source line is at 0 V. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the transistor 55 to provide Vbl_sense, e.g., 0.5 V, on the bit line. A Vbl selector 173 may pass a relatively high voltage such as Vdd to the drain 57, which is higher than the control gate voltage on the transistor 55, to provide the source-follower mode during sensing operations.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
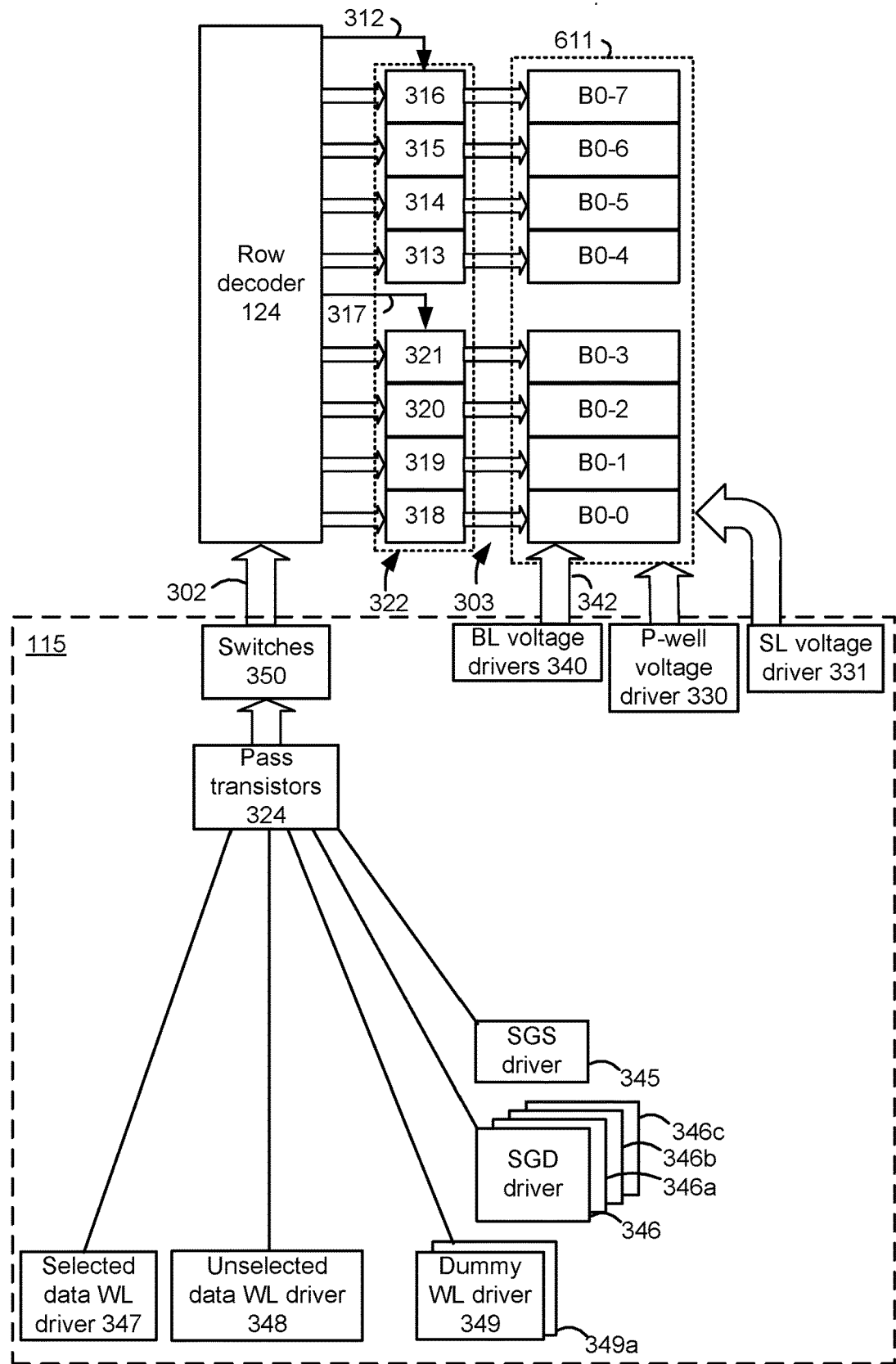
FIG. 3 depicts an example implementation of the power control circuit 115 of FIG. 1A for providing voltages to blocks of memory cells in a plane.

FIG. 3 depicts an example implementation of the power control circuit 115 of FIG. 1A for providing voltages to blocks of memory cells in a plane. The circuitry shown can be repeated for each plane of a die, in one approach. In this example, the memory structure 126 includes a set of four related blocks, B0-0 to B0-3, and another set of four related blocks, B0-4 to B0-7. See also FIG. 4. The blocks can be in one or more planes. The row decoder 124 of FIG. 1A provides voltages to word lines and select gate control lines of each block via pass transistors 322. In one approach, a separate row decoder is provided for each block. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B0-4 to B0-7, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

The voltage drivers can include a selected data word line (WL) driver 347, which provides a voltage on a data word line selected during a program or read operation. The driver 347 can provide a pre-charge voltage and a program voltage on WLn during a program loop of a program operation. A driver 348 can be used for unselected data word lines, and dummy word line drivers 349 and 349a can be used to provide voltages on dummy word lines WLDD and WLDS, respectively, in FIG. 6.

The voltage drivers can also include separate SGD drivers for each sub-block. For example, SGD drivers 346, 346a, 346b and 346c can be provided for SB0, SB1, SB2 and SB3, respectively, such as in FIG. 7A. The SGD drivers provide a voltage to a control line connected to the control gates of an SGD transistor (drain-side select gate transistor). In one option, an SGS driver 345 is common to the different sub-blocks in a block, and provides a voltage to a control line connected to the control gates of the SGS transistors (source-side select gate transistors).

The various components, including the row decoder, may receive commands from a controller such as the state machine 112 or the controller 122 to perform the functions described herein.

The p-well voltage driver 330 provides a voltage Vp-well to the p+ contact 612b in the p-well region 611b, e.g., via the conductive path 682. See FIG. 6. In one approach, the p-well region 611b is common to the blocks. Vp-well can be the same as Verase in FIGS. 12 and 13. A set of bit lines 342 is also shared by the blocks. The source line (SL) voltage driver 331 provides a voltage Vs1 to the n+ contact 612c in the p-well region 611b, e.g., via the local interconnect 651.

Bit line voltage drivers 340 include voltage sources which provide voltages to the bit lines 342. The bit line voltage for sensing in an erase verify test can be 0.5 V, for example.

In a stacked memory device such as depicted in FIGS. 4 to 7B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 4:
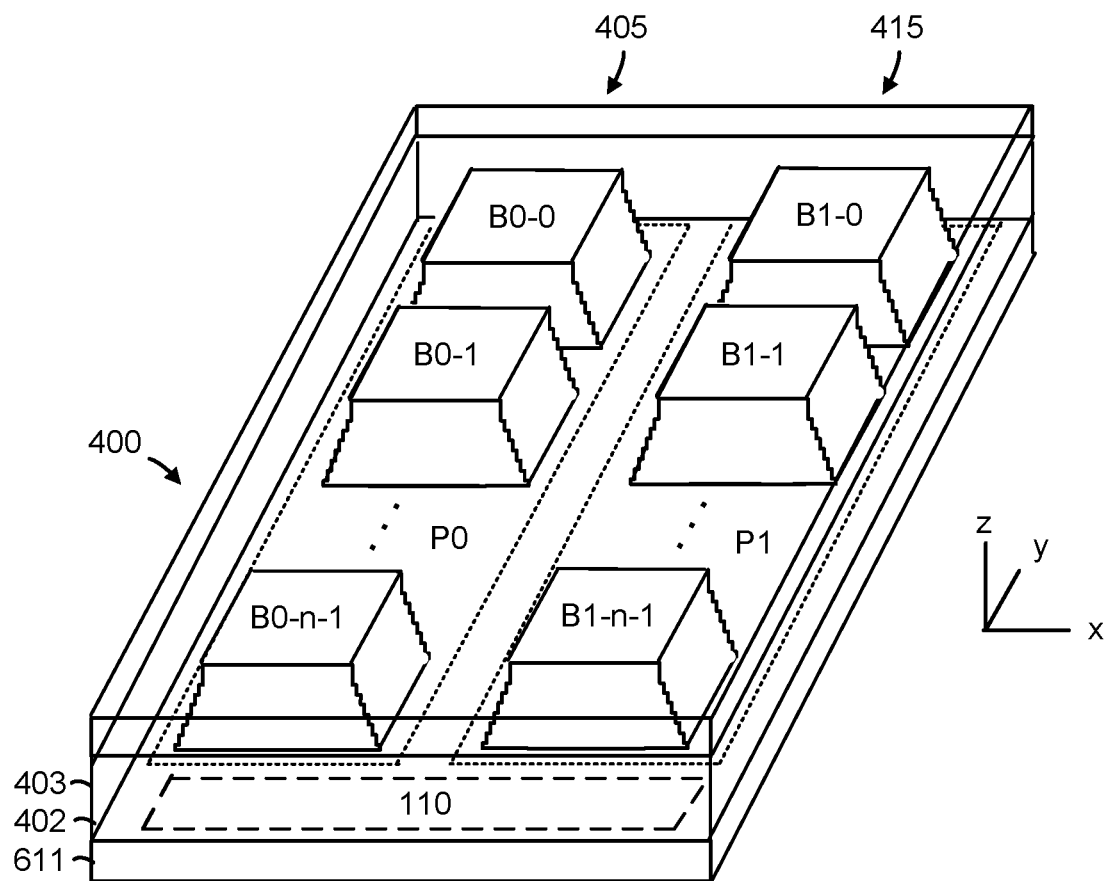
FIG. 4 is a perspective view of an example memory die 400 in which blocks are provided in respective planes P0 and P1, consistent with FIG. 1A.

FIG. 4 is a perspective view of an example memory die 400 in which blocks are provided in respective planes P0 and P1, consistent with FIG. 1A. The memory die includes a substrate 611, an intermediate region 402 in which blocks of memory cells are formed, and an upper region 403 in which one or more upper metal layers are patterned such as to form bit lines. Planes P0 and P1 represent respective isolation regions which are formed in the substrate 611. Further, a first block sequence 405 of a number n blocks, labelled B0-0 to B0-*n*-1, are formed in P0, and a second block sequence 415 of a number n blocks, labelled B1-0 to B1-*n*-1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erase concurrently.

The substrate 611 can also carry circuitry under the blocks, and one or more lower metal layers which are patterned in conductive paths to carry signals of the circuitry. The commands in FIG. 10 provide a pass/fail status for erase operations in planes P0 and P1 as an example.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

While the above example is directed to a 3D memory device with vertically extending NAND strings, the techniques provided herein are also applicable to a 2D memory device in which the NAND strings extend horizontally on a substrate.

Figure 5:
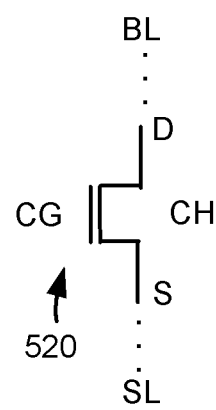
FIG. 5 depicts an example transistor 520 in the memory structure 126 of FIG. 1A.
Figure 6:
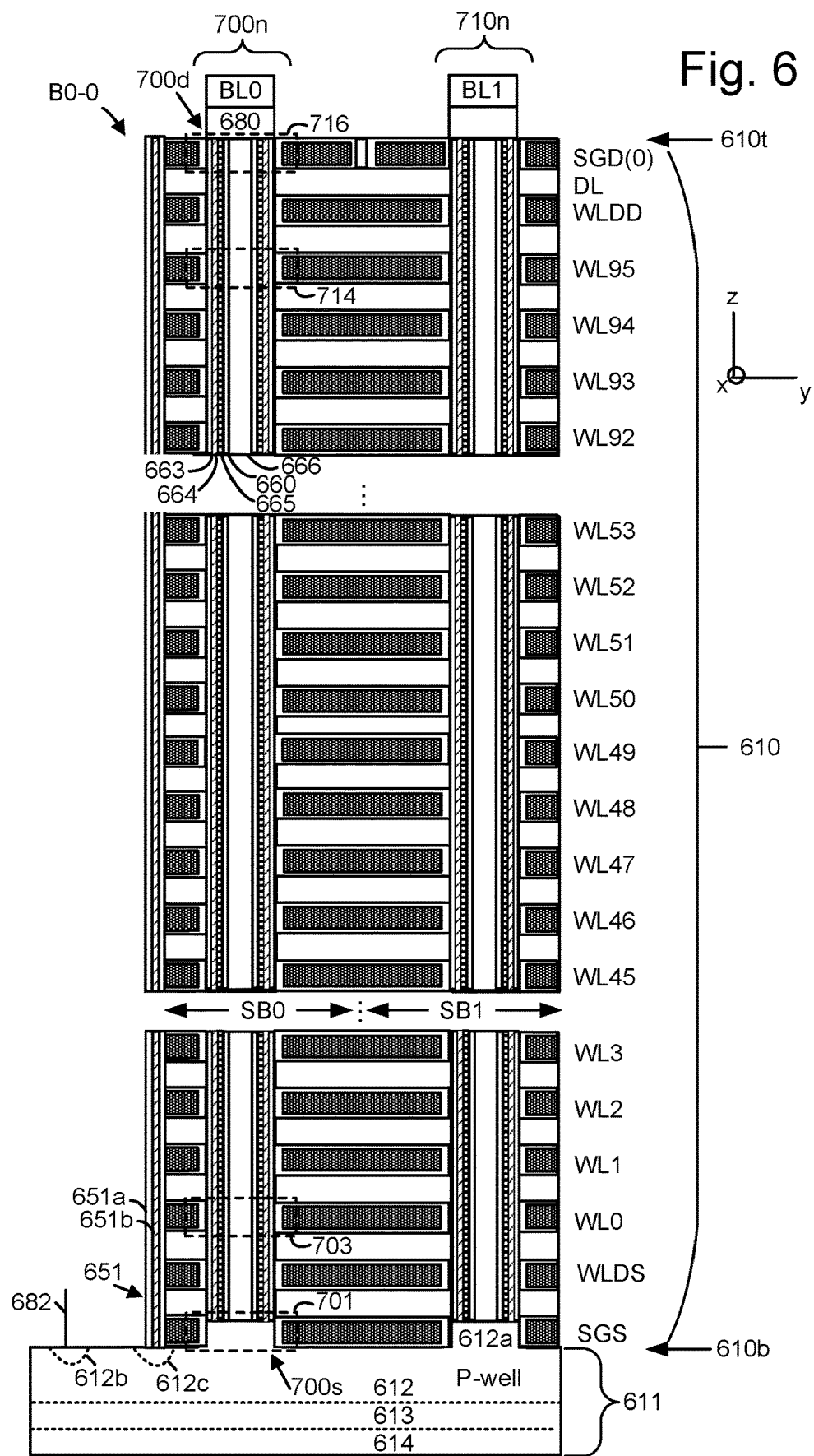
FIG. 6 depicts an example cross-sectional view of a portion of the block B0-0 of FIG. 4, including NAND strings 700n and 710n.

FIG. 5 depicts an example transistor 520 in the memory structure 126 of FIG. 1A. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string, FIG. 6 depicts an example cross-sectional view of a portion of the block B0-0 of FIG. 4, including NAND strings 700*n* and 710*n*. In this example, the NAND strings 700*n* and 710*n* are in different sub-blocks SB0 and SB1, respectively. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

A top 610*t* and bottom 610*b* of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunneling layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 611. In one approach, the substrate includes a p-well region 611*a* (see also FIG. 3) connected to the source ends of the NAND strings. The p-well region may comprise epitaxial regions 612 which extend upward adjacent to the source-side select gate transistors. The p-well region can include an n+ contact 612*c* connected to a local interconnect 651 for receiving a source line voltage, and a p+ contact 612*b* connected to a conductive path 682 for receiving a p-well voltage. The local interconnect 651 can comprise a conductive material 651*b* such as metal surrounded by insulating material 651*a* to prevent conduction with the metal of the adjacent word lines. The p-well region is formed in an n-well 613, which in turn is formed in a p-type semiconductor region 614 of the substrate, in one possible implementation.

The NAND string 700*n* has a source end 700*s* at a bottom 610*b* of the stack 610, connected to the p-well. The NAND string 700*n* also has a drain end 700*d* at a top 610*t* of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate via the local interconnect 651, causing the electrons to return to the channel from the charge trapping layer.

Figure 7A:
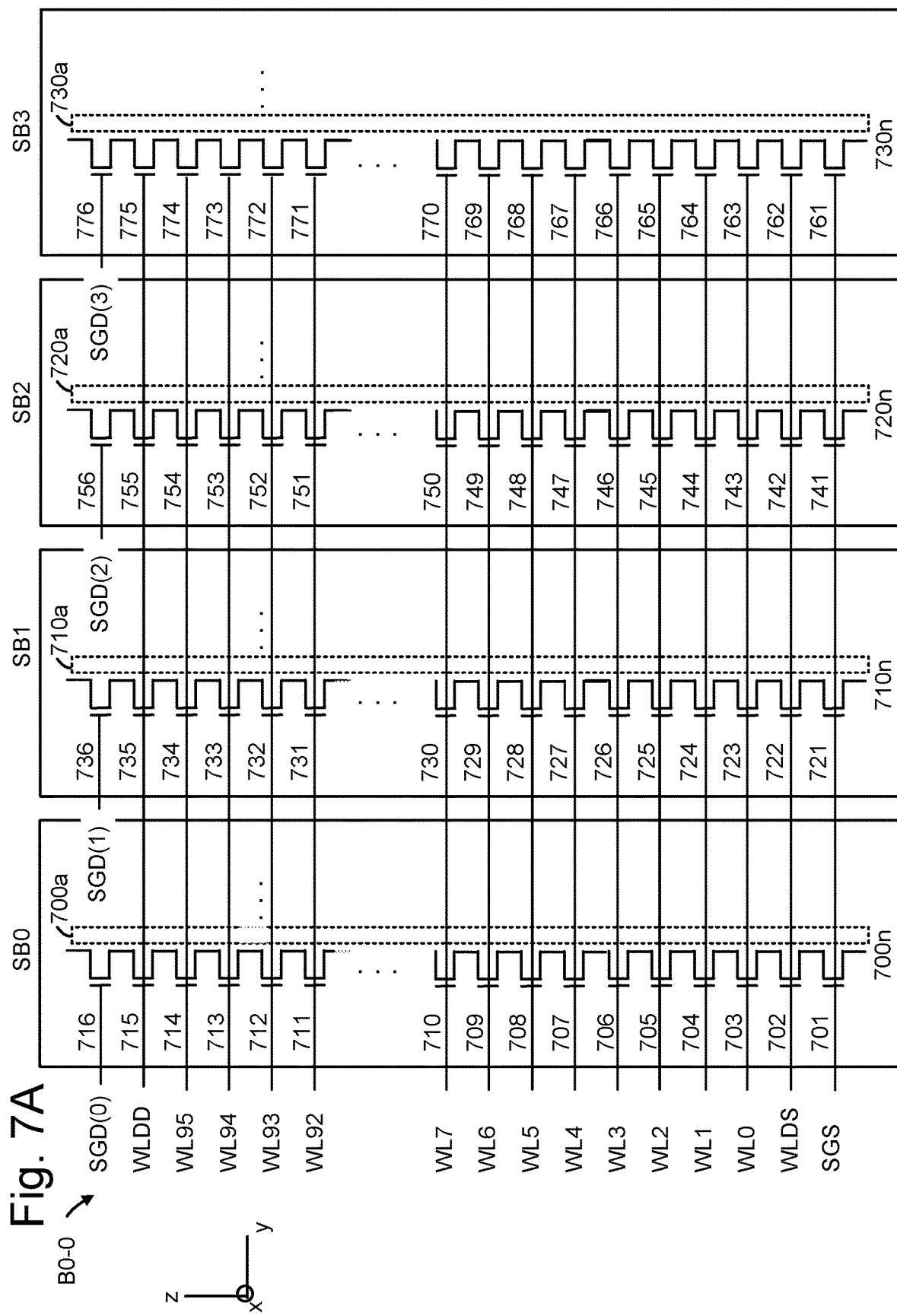
FIG. 7A depicts an example view of NAND strings in the block B0-0 which is consistent with FIGS. 4 and 6.

FIG. 7A depicts an example view of NAND strings in the block B0-0 which is consistent with FIGS. 4 and 6. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

In an erase operation, typically the entire block is erased, although a partial block erase is also possible.

The plurality of memory cells of B0-0 are arranged in NAND strings, where each NAND string comprising a continuous charge trapping layer along a length of the NAND string. The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

FIG. 7B depicts an example top view of the block B0-0 of FIG. 7A, with respective NAND strings, bit lines and sense circuits. The view is in the x-y plane. Each circle represents a NAND string. In this example, sixteen NAND strings per sub-block are depicted. SB0 includes the NAND string 700n of FIG. 7A and additional NAND strings 700n1-700n15. SB1 includes the NAND string 710n of FIG. 7A and additional NAND strings 710n1-710n15. SB2 includes the NAND string 720n of FIG. 7A and additional NAND string 720n1-720n15. SB3 includes the NAND string 730n of FIG. 7A and additional NAND strings 730n1-730n15.

A set of bit lines BL0-BL15 are connected to the NAND strings. Each bit line is connected to a respective set of NAND strings, including one NAND string in each sub-block. For example, BL0 is connected to NAND strings 700n, 710n, 720n and 730n in a set of NAND strings 799, BL1 is connected to NAND strings 700n1, 710n1, 720n1 and 730n1, and so forth. Each bit line is also connected to a respective sense circuit, consistent with the sense circuits 60-63 of FIG. 2. For example, BL0-BL15 are connected to sense circuits SC0-SC15, respectively.

In a verify test in an erase operation, a verify voltage VvEr1 or VvEr2 is applied to the word lines. See FIGS. 12 and 13. At the same time, each sense circuit senses a current on a respective bit line based on a sum of the currents in the respective NAND strings connected to the bit line. For example, SC0 can sense a current on BL0 based on currents in the NAND strings 700n, 710n, 720n and 730n Thus, a verify test can involve sensing a current in a set of NAND strings connected to each bit line. A set of NAND strings passes the verify test if the current is above a specified level, e.g., the threshold voltages of the memory cells in the set of NAND strings are below the verify voltage. A block passes the verify test if all, or nearly all, of the set of NAND strings pass the verify test. In other words, a block passes the verify test if none, or no more than a specified portion of the sets of NAND strings of the block, fail the verify test. In another possible approach, the sensing occurs one sub-block at a time for each bit line.

A NAND string can pass or fail a verify test when a verify voltage is applied to the word lines. A NAND string fails a verify test when the sensed current in the NAND string is less than a specified level. A failure indicates the Vth is higher than the verify voltage for one or more memory cells in the NAND string. In contrast, a NAND string passes a verify test when the sensed current in the NAND string is greater than the specified level. A pass indicates the Vth is lower than the verify voltage for all of the memory cells in the set of NAND strings. See also various examples of verify tests in FIG. 9D-9H.

A set of NAND strings, which may comprise all NAND strings in a block or sub-block, for example, can be considered to pass a verify test when all or nearly all of the NAND strings pass the verify test. For example, a pass may occur when no more than 1-5% of the NAND strings fail the verify test. In practice, it is simpler for the circuitry to count the number of NAND strings which fail the verify test rather than to count the much larger number of NAND strings which pass the verify test.

FIG. 8A-8C depict examples of word line voltage in different erase processes. As mentioned at the outset, an erase operation can be performed using an all word line erase process or an odd-even word line erase process, for example. In the all word line erase, all of the word lines are held at a low, erase-enable voltage (Ven) such as 0 V while the channels of the NAND strings are charged up. This creates a large channel-to-control gate electric field for each of the memory cells, which drive hole injection into the trapping layer, lowering the Vth of the memory cells. In the odd-even word line erase, the odd-numbered word lines are held at Ven and the even-numbered word lines are held at a higher, erase-inhibit voltage (Vinh) such as 10 V, while the channels are charged up. With Ven applied to the word lines, this creates a large channel-to-control gate electric field for each of the memory cells connected to the odd-numbered word lines so that the memory cells connected to the odd-numbered word lines are erased. However, with Vinh applied to the word lines, the channel-to-control gate electric field is not large enough for an erase so that the memory cells connected to the even-numbered word lines are not erased.

Separately, either before or after the erasing of the memory cells connected to the odd-numbered word lines, the even-numbered word lines are held at Ven and the odd-numbered word lines are held at Vinh while the channels are charged up, so that the memory cells connected to the even-numbered word lines are erased while the memory cells connected to the odd-numbered word lines are not erased.

Additionally, when odd-even word line erase is used, the verify process can involve a concurrent verify test for all of the memory cells, so that the verify test for the memory cells connected to the odd-numbered word lines is concurrent with the verify test for the memory cells connected to the even-numbered word lines. Or, the verify process can involve a verify test for the memory cells connected to the odd-numbered word lines which is separate, either before or after, a verify test for the memory cells connected to the even-numbered word lines.

FIG. 8A depicts word line voltages in an all word line erase process, consistent with the NAND string 700n of FIG. 7A. Ven=0 V, for example, is applied to all of the data word lines WL0-WL95 so that the memory cells connected to these word lines, including the memory cells 703-714, are erased. The dummy word lines can receive Vinh. The channel of the NAND can be charged up from the source end by applying an erase voltage to the substrate and/or from the drain using GIDL.

FIG. 8B depicts word line voltages in an odd-numbered word line erase process, consistent with the NAND string 700n of FIG. 7A. Ven=0 V is applied to the odd-numbered word lines, e.g., WL1, WL3 . . . WL95 while Vinh=10 V is concurrently applied to the even-numbered word lines, e.g., WL0, WL2 . . . WL94.

FIG. 8C depicts word line voltages in an even-numbered word line erase process, consistent with the NAND string 700n of FIG. 7A. Ven=0 V is applied to the even-numbered word lines, e.g., WL0, WL2 . . . WL94 while Vinh=10 V is concurrently applied to the odd-numbered word lines, e.g., WL1, WL3 . . . WL95.

FIG. 8D depicts word line voltages in an all word line verify process, consistent with the NAND string 700n of FIG. 7A. A verify voltage, VvEr, is applied to each of the word lines concurrently while sensing a current in the NAND string. The verify voltage could be VvEr1 or VvEr2 such as depicted in FIGS. 10A and 10B. The all word line verify process is optimal in terms of time consumed compared to the odd-even verify process.

FIG. 8E depicts word line voltages in an odd-numbered word line verify process, consistent with the NAND string 700n of FIG. 7A. The memory cells connected to the odd-numbered word lines are subject to a verify test by applying a verify voltage VvEr to these word lines. A pass voltage, Vread, such as 8 V, is applied to the even-numbered word lines during the verify test to provide the associated memory cells in a strongly conductive state so that the sensed current in the NAND string will be primarily based on the threshold voltages of the memory cells connected to the odd-numbered word lines.

FIG. 8F depicts word line voltages in an even-numbered word line verify process, consistent with the NAND string 700n of FIG. 7A. The memory cells connected to the even-numbered word lines are subject to a verify test by applying a verify voltage VvEr to these word lines. Vread is applied to the odd-numbered word lines during the verify test to provide the associated memory cells in a strongly conductive state so that the sensed current in the NAND string will be primarily based on the threshold voltages of the memory cells connected to the even-numbered word lines. The odd-even verify process tends to ensure that the memory cells are more uniformly erased.

Figure 9A:
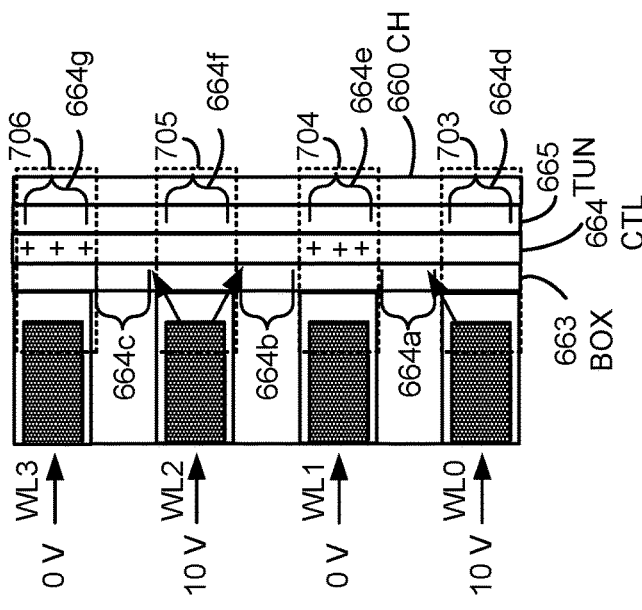
FIG. 9A depicts a portion of the NAND string 700n of FIG. 7A, showing an accumulation of holes in the charge trapping layer (CTL) 664, including in inter-word line CTL regions 664a, 664b and 664c, after an all word line erase operation.

FIG. 9A depicts a portion of the NAND string 700n of FIG. 7A, showing an accumulation of holes in the charge trapping layer (CTL) 664, including in inter-word line CTL regions 664a, 664b and 664c, after an all word line erase operation. The portion of the NAND string includes the memory cells 703-706 and the associated word lines WL0-WL3, respectively. In FIG. 9A-9E, the blocking oxide (BOX) layer 63, charge trapping layer (CTL) 664, tunnel oxide layer (TUN) 665 and channel (CH) 660 are also depicted. Holes are depicted by "+" and electron are depicted by "−". The inter-word line CTL regions 664a, 664b and 664c refer to regions of the NAND string which are between the word lines WL0 and WL1, WL1 and WL2 and WL2 and WL3, respectively.

During erase, the voltage of the channel is boosted by an erase pulse while holding the word line voltage at Ven=0 V. As a result, holes are in the channel are injected into the portions of the CTL which are directly adjacent to the word lines. For example, the CTL portions 664d-664g are directly adjacent to WL0-WL3, respectively. Moreover, due to a fringing field (represented by the slanted arrows), holes can also be injected into the inter-word line CTL regions. This is more likely to occur as the magnitude of the erase voltage is higher. For example, when incremental step pulse erasing is used, the erase voltage Verase steps up in each erase-verify iteration after the initial erase-verify iteration such as depicted in FIGS. 12 and 13. The injection of holes into the inter-word line CTL regions is therefore more likely during later erase-verify iterations of an erase operation, when Verase is higher. After the erase operation, a program operation is performed as depicted in FIG. 9B.

Figure 9B:
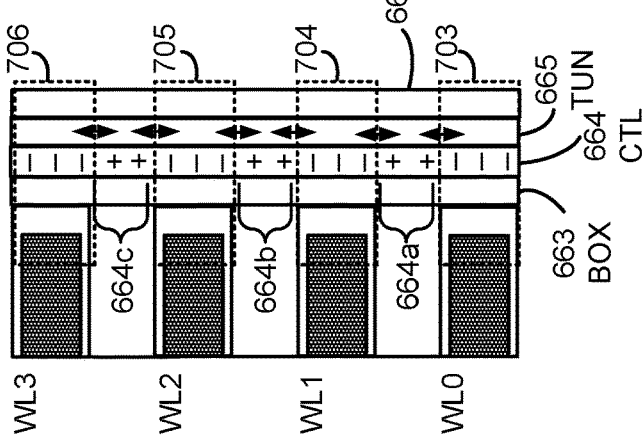
FIG. 9B depicts the portion of the NAND string 700n of FIG. 9A after programming, where holes remain in the inter-word line CTL regions 664a, 664b and 664c, attracting the electrons and causing data retention loss for the memory cells.

FIG. 9B depicts the portion of the NAND string 700n of FIG. 9A after programming, where holes remain in the inter-word line CTL regions 664a, 664b and 664c, attracting the electrons and causing data retention loss for the memory cells. During programming of a word line, electrons are injected into the portion of the CTL which is directly adjacent to the word lines. This is depicted by the electrons "−" in the CTL portions 664d-664g. However, the holes remain in the inter-word line CTL regions 664a-664c. The holes move in the CTL towards the memory cells, and attract some of the electrons away from the memory cells, in a lateral charge movement in the CTL, resulting in a data retention loss of the cells. This movement is represented by the double-arrows. This is undesirable as it can result in uncorrectable read errors.

Figure 9C:
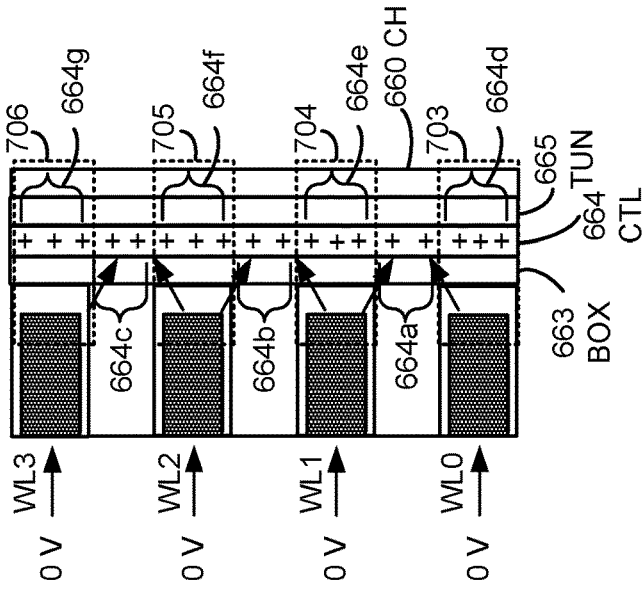
FIG. 9C depicts the portion of the NAND string 700n of FIG. 7A, showing an accumulation of holes in the charge trapping layer (CTL) 664, where the holes are not present in the inter-word line CTL regions 664a, 664b and 664c, after an erase of odd-numbered word lines.

FIG. 9C depicts the portion of the NAND string 700n of FIG. 7A, showing an accumulation of holes in the charge trapping layer (CTL) 664, where the holes are not present in the inter-word line CTL regions 664a, 664b and 664c, after an erase of odd-numbered word lines. During erase of the memory cells connected to WL1 and WL3, Vinh=10 V is applied to WL0 and WL2, creating a fringing field (represented by the slanted arrows) which reduces the accumulation of holes in the inter-word line CTL regions. Instead, the holes accumulate in the CTL regions 664e and 664g which are directly adjacent to WL1 and WL3, respectively.

Figure 9D:
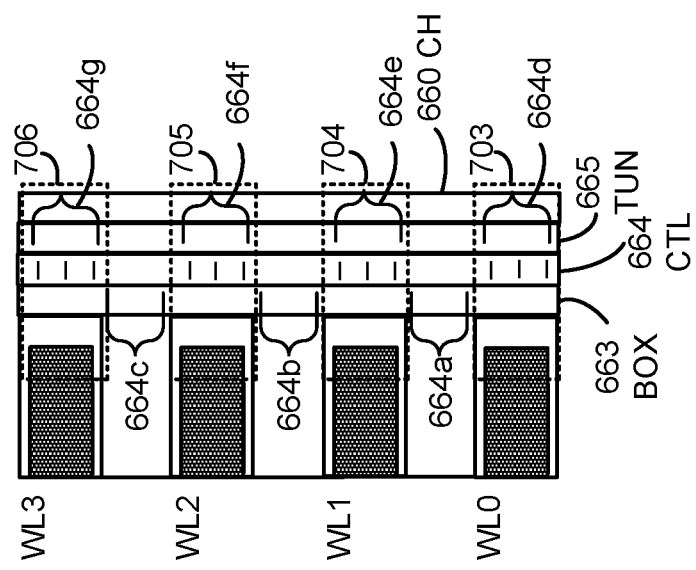
FIG. 9D depicts the portion of the NAND string 700n of FIG. 9C, showing an accumulation of holes in the charge trapping layer (CTL) 664, where the holes are not present in the inter-word line CTL regions 664a, 664b and 664c, after an erase of even-numbered word lines.

FIG. 9D depicts the portion of the NAND string 700n of FIG. 9C, showing an accumulation of holes in the charge trapping layer (CTL) 664, where the holes are not present in the inter-word line CTL regions 664a, 664b and 664c, after an erase of even-numbered word lines. In an analogous situation as FIG. 9C, during erase of the memory cells connected to WL0 and WL2, Vinh applied to WL1 and WL3 creates a fringing field (represented by the slanted arrows)

which reduces the accumulation of holes in the inter-word line CTL regions. Instead, the holes accumulate in the CTL regions 664d and 664f which are directly adjacent to WL0 and WL2, respectively.

Figure 9E:
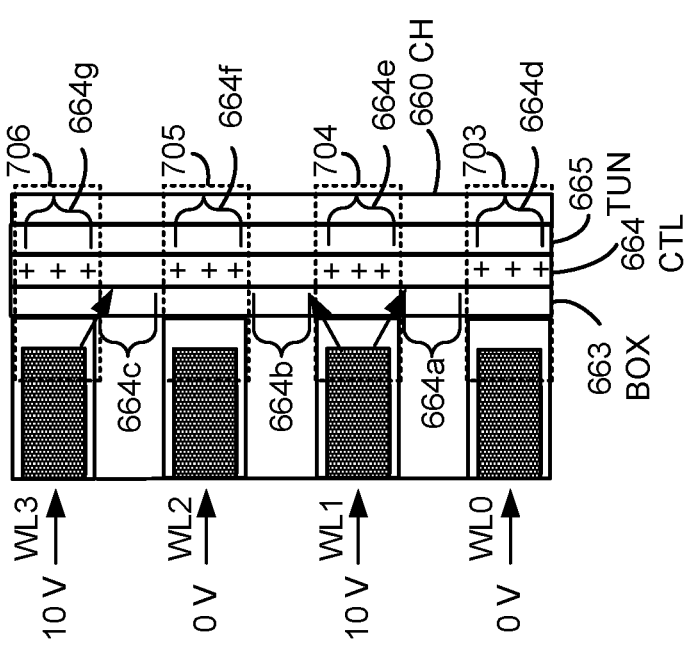
FIG. 9E depicts the portion of the NAND string 700n of FIG. 9D after programming, where holes are not present in the inter-word line CTL regions 664a, 664b and 664c, so that data retention of the memory cells is improved.

FIG. 9E depicts the portion of the NAND string 700n of FIG. 9D after programming, where holes are not present in the inter-word line CTL regions 664a, 664b and 664c, so that data retention of the memory cells is improved. When the memory cells connected to WL0-WL3 are programmed, electrons accumulate in the CTL regions 664d-664g which are directly adjacent to WL0-WL3, respectively. Data retention is improved since the holes are not present, or are present by a reduced amount, in the inter-word line CTL regions.

FIG. 10A depicts threshold voltage (Vth) distributions for an eight-state memory device. Eight data states, or three bits per cell, are depicted as an example. The techniques herein can apply to other modes include one or more bits per cell. In FIGS. 10A and 10B, the vertical axis depicts a number of memory cells on a logarithmic scale and the horizontal axis depicts a threshold voltage on a linear scale. The Vth distributions can represent memory cells connected to a word line or all memory cells in a block. After erasing the block, the Vth distribution 1000 is obtained, representing the erased state. The erase operation is completed when the Vth of all, or nearly all, of the memory cells is below a verify voltage of VvEr2.

The memory cells are then subject to a programming operation. Each of the memory cells will have an assigned data state. Some of the memory cells are assigned to the erased state and are not programmed. Most of the memory cells are programmed to higher states, such as A-F, in this example, as represented by Vth distributions 1001-1007, respectively. These memory cells are subject to verify tests using verify voltages of VvA-VvG. The programming of the higher state memory cells can disturb the erased state memory cells, resulting in the widened and upshifted Vth distribution 1001. Additionally, after programming, data retention loss results is a widening of the Vth distributions, including a lowering of the lower tails of the Vth distributions. For example, the Vth distributions 1001-1007 transition to the Vth distributions 1011-1017, respectively, due to data retention loss.

FIG. 10B depicts example Vth distributions in an erase operation. In this example, five erase pulses are applied in corresponding erase-verify iterations. After a first erase pulse, the threshold voltages of the memory cells, as depicted in FIG. 10A, transition to the Vth distribution 1020. The memory cells fail a verify test which tests their Vth relative to a first verify voltage, VvEr1. After a second erase pulse, the threshold voltages of the memory cells transition to the Vth distribution 1021. The memory cells pass a verify test which tests their Vth relative to VvEr1. In this case, the region 1021a of the Vth distribution 1021 represents a count of the memory cells or NAND strings or sets of NAND strings connected to a bit line, which fail the verify test. The count is less than a threshold level such that the verify test is considered to be passed.

After a third erase pulse, the threshold voltages of the memory cells transition to the Vth distribution 1022. The memory cells fail a verify test which tests their Vth relative to a second verify voltage, VvEr2 which is lower than VvEr1. After a fourth erase pulse, the threshold voltages of the memory cells transition to the Vth distribution 1023. The memory cells again fail a verify test which tests their Vth relative to VvEr2. After a fifth erase pulse, the threshold voltages of the memory cells transition to the Vth distribution 1024. The memory cells pass a verify test which tests their Vth relative to VvEr2. In this case, the region 1024a of the Vth distribution 1024 represents a count of the memory cells or NAND strings or sets of NAND strings connected to a bit line, which fail the verify test. The count is less than a threshold level such that the verify test is considered to be passed. The count used to determine a pass or fail status of a verify test can be the same or different for the first verify tests compared to the second verify test.

Generally, a control circuit can count a number of NAND strings which pass or fail a verify test to determine whether a set of memory cells passes or fails the verify test.

FIG. 10C depicts threshold voltage (Vth) distributions for a four-state memory device. The Vth distribution 1030 represents the erased state immediately after erasing, and the Vth distributions 1032, 1034 and 1036 represent the A, B and C states, respectively, without data retention loss. The Vth distribution 1031 represents the erased state with program disturb and the Vth distributions 1033, 1035 and 1037 represent the A, B and C states, respectively, with data retention loss. With a smaller number of data states compared to FIG. 10A, there is generally a larger spacing between adjacent Vth distributions. As a result, a larger amount of data retention loss can be accommodated without resulting in uncorrectable read errors. The erase operation can therefore be adjusted to have a longer all word line erase phase before transitioning to the odd-even word line erase phase. This can be achieved, e.g., by using a lower VvEr1. In other words, VvEr1 can be lower when erasing a plurality of memory cells when the number of data states which will be stored by the plurality of memory cells is smaller. VvEr1 can be higher when erasing a plurality of memory cells when the number of data states which will be stored by the plurality of memory cells is larger, so that VvEr1 is an increasing function of the number of data states. It can also be said that VvEr1-VvEr2 (an amount by which VvEr1 exceeds VvEr2) can be smaller when erasing a plurality of memory cells when the number of data states which will be stored by the plurality of memory cells is smaller. VvEr1-VvEr2 can be an increasing function of the number of data states.

In another example, sixteen data states are used. In this case, VvEr1, or VvEr1-VvEr2, can be larger than for the case where eight data states are used.

In one approach, a control circuit is configured to set the first voltage of the first verify test to be an increasing function of the number of data states to which the memory cells will be programmed. Thus, the first voltage is greater when the number of data states is greater. For instance, the memory cells may be in a block which is designated by a control circuit to a store a certain number of data states or bits per cell. A memory device can include different blocks which are designated to a store different numbers of data states.

Figure 11B:
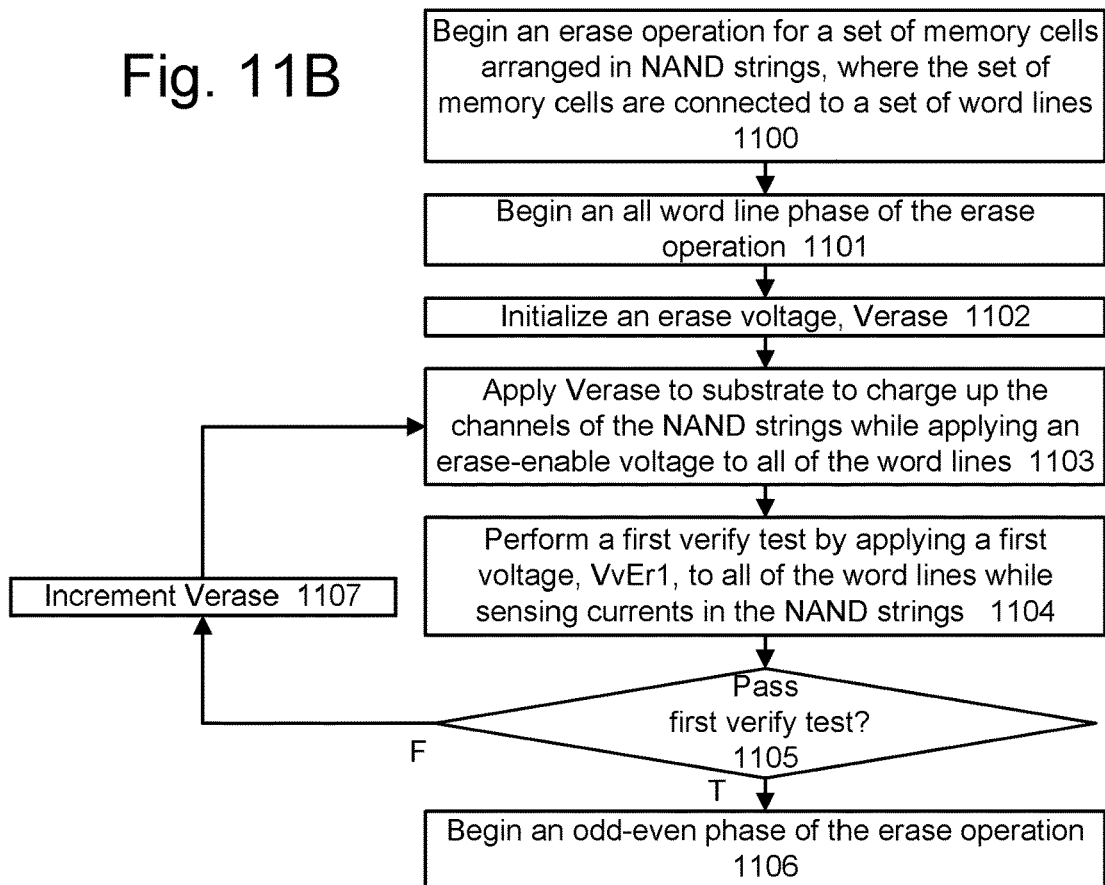
FIG. 11B depicts a flowchart of an example all word line phase of an erase operation, consistent with step 1090 of FIG. 11A.

FIG. 11A depicts a flowchart of an example erase operation. Step 1090 includes erasing a plurality of memory cells using all word line erase until a first verify test is passed. See FIG. 11B for an example implementation. Step 1091 includes erasing the plurality of memory cells further using all odd-even word line erase until a second verify test is passed. See FIG. 11C or 11D for an example implementation.

FIG. 11B depicts a flowchart of an example all word line phase of an erase operation, consistent with step 1090 of FIG. 11A. Step 1100 begins an erase operation for a set of memory cells arranged in NAND strings, where the set of memory cells are connected to a set of word lines. Step 1101 begins an all word line phase of the erase operation. Step 1102 initializes an erase voltage, Verase. Step 1103 includes applying Verase to a substrate to charge up the channels of the NAND strings while applying an erase-enable voltage to all of the word lines, e.g., all of the data word lines. Step 1104 includes performing a first verify test by applying a first voltage, VvEr1, to all of the word lines while sensing currents in the NAND strings.

A decision step 1105 determines if the first verify test is passed. If the decision step is false, step 1107 increments Verase and step 1103 is reached again. Each pass through steps 1103-1105 represents an instance of an erase-verify iteration. If the decision step 1105 is true, step 1106 begins an odd-even phase of the erase operation. When the decision step 1005 is true, an erase milestone has been reached for the plurality of memory cells. This can involve the processes of FIG. 11C or 11D, for instance.

As mentioned, the transition to the odd-even word line erase can be optimized based on factors such as temperature, number of program-erase cycles, number of data states which will be programmed in the memory cells, and sub-block position when the sub-blocks of a block are verified separately in the erase operation. For example, a control circuit can be configured to adjust the first voltage based on a number of program-erase cycles of the plurality of memory cells, where the first voltage is a decreasing function of the number of program-erase cycles. This approach recognizes that data retention loss can be greater when the number of P-E cycles is lower. By increasing the first voltage when the number of P-E cycles is lower, the number of erase-verify iterations which are performed using the all word line erase is reduced so that the accumulation of holes in the inter-word line CTL regions is also reduced. In another approach, a control circuit is configured to sense a temperature and to adjust the first voltage based on the temperature, where the first voltage is an increasing function of the temperature. This approach recognizes that data retention loss can be greater when the temperature is greater.

In another option, as mentioned in connection with FIG. 10C, the first voltage of the first verify test can be an increasing function of the number of data states to which the memory cells will be programmed.

In another option, the plurality of memory cells being erased are arranged in a sub-block among a plurality of sub-blocks in a block, and a control circuit is configured to set the first voltage based on a position of the sub-block in the block. This allows the verify test to be tailored to each sub-block, when each sub-block is separately verified. In some cases, data retention loss can be greater for some sub-blocks based on factors such as sub-block programming order. For example, if the verify order is SB0, SB1, SB2 then SB3 (see FIG. 7A), the memory cells of SB0 can experience a greater data retention loss since they subject to inhibit voltages when the other sub-blocks are verified.

Another option is to transition from the all word line phase to the odd-even phase if a threshold number of erase-verify iterations have been performed even while the first verify test has not yet passed. This can help avoid the accumulation of holes in the inter-word line charge trap regions due to an excessive number of erase-verify iterations using the all word line process. For example, assume the threshold number is three erase-verify iterations. The erase operation might perform three erase-verify iterations using the all word line erase in which the first verify test is failed. Instead of continuing with a fourth erase-verify iteration using the all word line erase, the erase operation transitions to a fourth erase-verify iteration using the odd-even word line erase.

A control circuit can issue commands to perform the hybrid erase operation, e.g., an all word line erase followed by an odd-even word line erase (or even-odd). The control circuit can be on the same die as the memory cells or on a separate die. In one approach, there is a dedicated command CMD XX: 60h-Address(3 cycle)-XXh=>Busy(tERASE) →Ready. "60h" denotes an erase block command in a first command cycle. "Address (3 cycle)" denotes a 3 cycle or byte address of a block to be erased. The address can include information to identify a plane and a block, for example. "XXh" is a dedicated status return command. The status can be a pass/fail result of a verify test and/or of the erase operation. "Busy" indicates that a ready/busy pin of the chip has a busy status and "Ready" indicates that the ready/busy pin of the chip has a ready status.

In another approach, a prefix command is used with the format: Prefix CMD YY-60 h-Address(3 cycle)-D0h=>Busy (tERASE)→Ready. "D0h" denotes a second command cycle. The "Prefix CMD YY" thus precedes the normal (non-hybrid) erase command, e.g., for an all word line erase with no odd-even word line erase.

In one possible approach, the hybrid erase is initiated using a prefix command which is transmitted with an erase command to the memory chip. In another possible approach, the detection is initiated by a device parameter on the memory chip.

Commands can be issued by the off-chip controller 122 to the on-chip control circuitry 110 including the state machine 112 in connection with an erase operation, for example. The on-chip control circuitry 110 including the state machine 112 can report back to the controller 122 with a status of the erase operation. A prefix command is a command which precedes another related command. The prefix command can have a desired format and comprise one or more bytes, for instance.

Figure 11C:
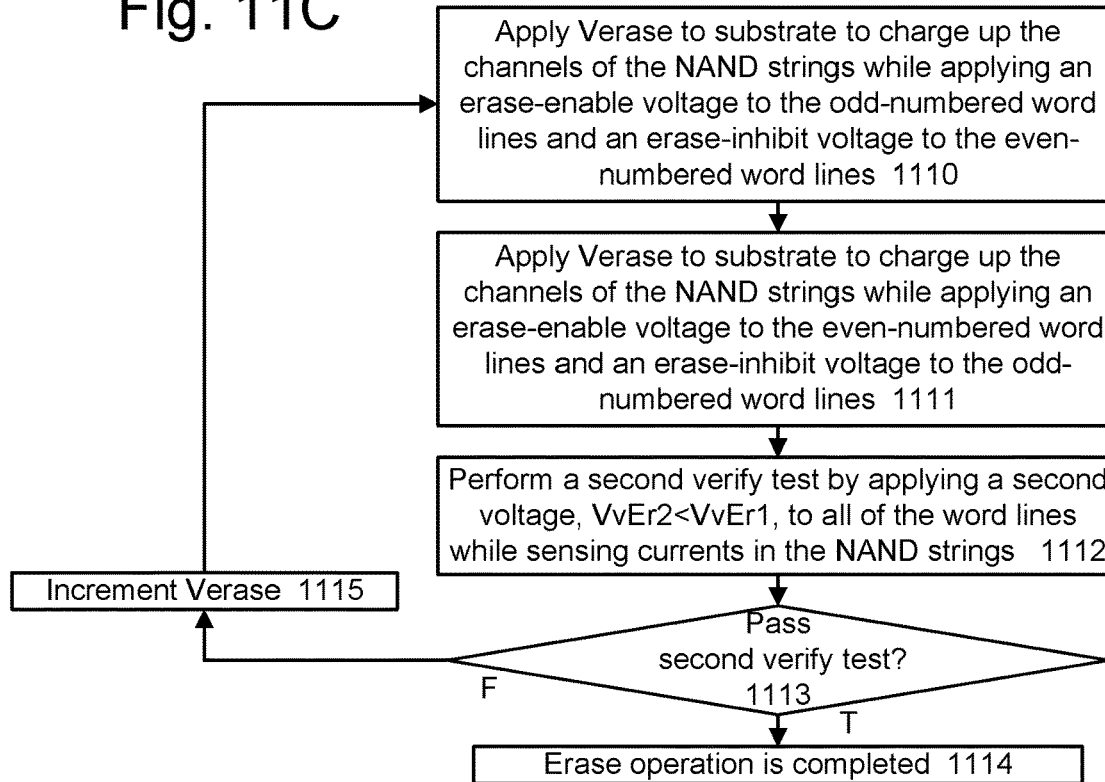
FIG. 11C depicts a flowchart of a first example odd-even phase of an erase operation which follows the flowchart of FIG. 11B, where the odd- and even-numbered word lines are verified concurrently, consistent with step 1091 of FIG. 11A.

FIG. 11C depicts a flowchart of a first example odd-even phase of an erase operation which follows the flowchart of FIG. 11B, where the odd- and even-numbered word lines are verified concurrently, consistent with step 1091 of FIG. 11A. Step 1110 involves applying Verase to the substrate to charge up the channels of the NAND strings while applying an erase-enable voltage to the odd-numbered word lines and an erase-inhibit voltage to the even-numbered word lines. Step 1111 involves applying Verase to the substrate to charge up the channels of the NAND strings while applying an erase-enable voltage to the even-numbered word lines and an erase-inhibit voltage to the odd-numbered word lines. Step 1112 includes performing a second verify test by applying a second voltage, VvEr2, to all of the word lines while sensing currents in the NAND strings.

A decision step 1113 determines if the second verify test is passed. If the decision step is false, step 1115 increments Verase and step 1110 is reached again. Each pass through steps 1110-1112 represents an instance of an erase-verify iteration. If the decision step 1113 is true, the erase operation is successfully completed at step 1114.

Note that a maximum allowable number of erase-verify iterations can be enforced in the erase operation such that the erase operation fails if it is not completed within the maximum allowable number of erase-verify iterations.

The order of steps 1110 and 1111 can be reversed. The odd-even phase can involve erasing odd-numbered word lines first, or even-numbered word lines first.

Figure 11D:
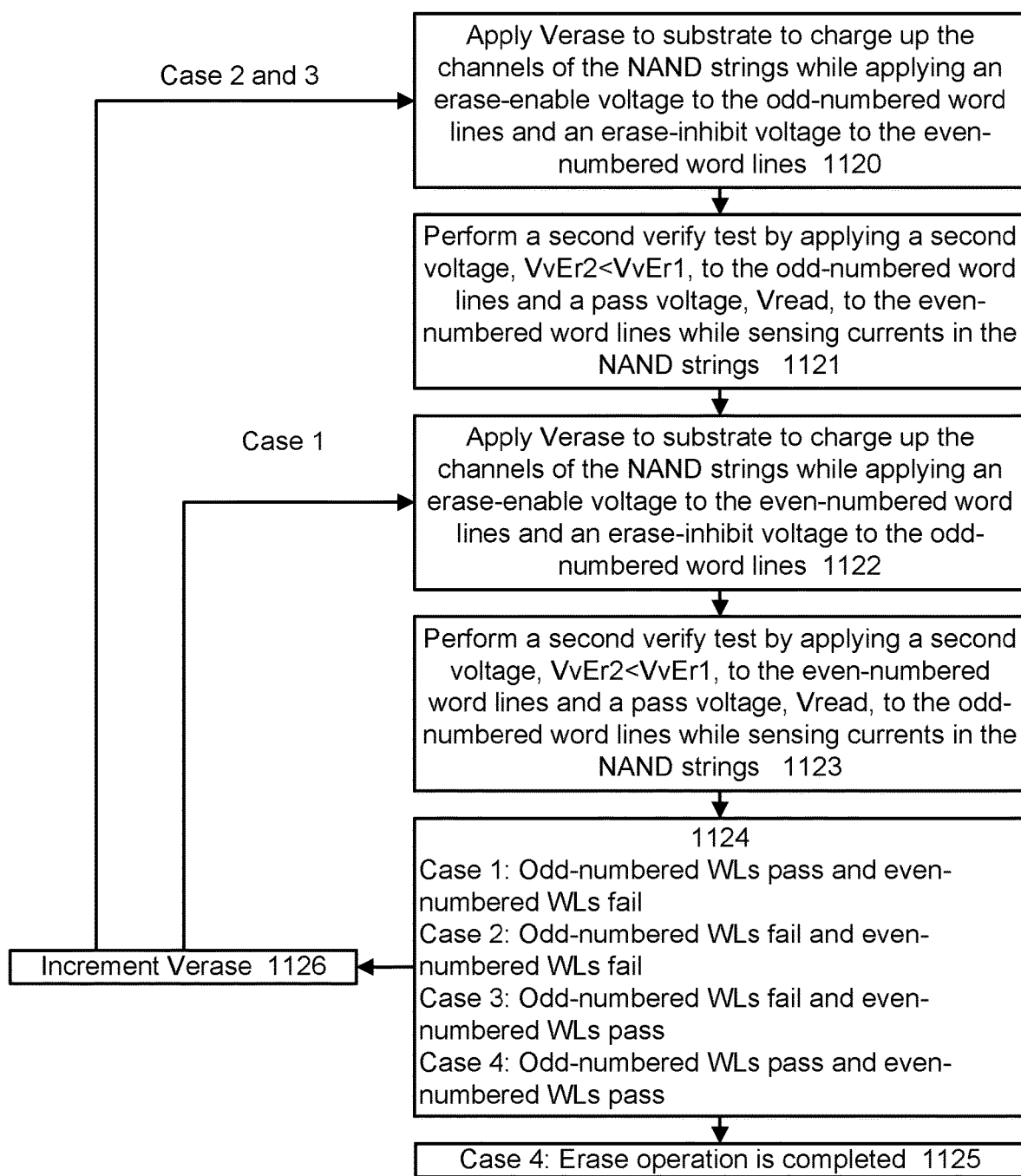
FIG. 11D depicts a flowchart of a second example odd-even phase of an erase operation which follows the flowchart of FIG. 11B, where the odd- and even-numbered word lines are verified separately, consistent with step 1091 of FIG. 11A.

FIG. 11D depicts a flowchart of a second example odd-even phase of an erase operation which follows the flowchart of FIG. 11B, where the odd- and even-numbered word lines are verified separately, consistent with step 1091 of FIG. 11A. Step 1120 includes applying Verase to the substrate to charge up the channels of the NAND strings while applying an erase-enable voltage to the odd-numbered word lines and an erase-inhibit voltage to the even-numbered word lines. Step 1121 includes performing a second verify test by applying a second voltage, VvEr2<VvEr1, to the odd-numbered word lines and a pass voltage, Vread, to the even-numbered word lines while sensing currents in the NAND strings. Step 1122 includes applying Verase to the substrate to charge up the channels of the NAND strings while applying an erase-enable voltage to the even-numbered word lines and an erase-inhibit voltage to the odd-numbered word lines. Step 1123 includes performing a second verify test by applying a second voltage, VvEr2<VvEr1, to the even-numbered word lines and a pass voltage, Vread, to the odd-numbered word lines while sensing currents in the NAND strings.

Step 1124 represents four possible cases which result from the second verify test. In case 1, the odd-numbered word lines pass and the even-numbered word lines fail. In case 2, the odd-numbered word lines fail and the even-numbered word lines fail. In case 3, the odd-numbered word lines fail and the even-numbered word lines pass. In case 4, the odd-numbered word lines pass and the even-numbered word lines pass. Step 1125 is reached with case 4, indicating that the erase operation is successfully completed. For cases 1-3, step 1126 increments Verase. Subsequently, for case 1, step 1122 is reached for a next erase-verify iteration which includes steps 1122 and 1123. For cases 2 and 3, step 1120 is reached for a next erase-verify iteration which includes steps 1120-1123.

In FIGS. 11C and 11D, to bias the odd-numbered word lines for erasing in the second phase (the odd-even word line erase phase), the control circuit is configured to apply an erase-enable voltage to the odd-numbered word lines while applying an erase-inhibit voltage to the even-numbered word lines; and to bias the even-numbered word lines for erasing in the second phase, the control circuit is configured to apply the erase-enable voltage to the even-numbered word lines while applying the erase-inhibit voltage to the odd-numbered word lines. The second phase follows a first phase, which is an all word line erase phase.

FIG. 12 depicts example waveforms in an erase operation consistent with FIGS. 11B and 11C. In FIGS. 12 and 13, the vertical direction denotes voltage and the horizontal direction denotes a common time scale. In FIG. 12, four erase-verify iterations EV1-EV4 are depicted as an example, where the erase operation is completed after EV4. However, in other examples, additional erase-verify iterations, not shown, could be performed. Or, fewer than four erase-verify iterations could be used. EV1 and EV2 are an example of one or more successive erase-verify iterations in the all word line phase of an erase operation where an all word line verify process is used such as in FIG. 8D, and EV3 and EV4 are an example of one or more successive erase-verify iterations in the odd-even word line phase of the erase operation, where an odd-even word line verify process is used such as in FIGS. 8E and 8F.

A voltage signal 1200 represents Verase, an erase voltage. This could be a voltage applied to a substrate and/or the bit lines of a block, for example. Erase pulses 1201, 1202, 1203, 1204, 1205 and 1206 have magnitudes of Verase1, Verase2, Verase3, Verase3, Verase4 and Verase4, respectively. Each erase pulse charges up the channels of the NAND strings in a block. The erase pulses may have a starting magnitude of, e.g., 15-20 V, and increase with each erase-verify iteration.

The voltage signals 1210 and 1230 represent Vw1_odd and Vw1_even, voltages applied to each of the odd- and even-numbered data word lines, respectively, of a block during the erase operation. During the erase pulse 1201 of EV1, Vw1_odd and Vw1_even are set to a voltage-enable voltage, Ven (a small positive voltage such as 0-0.5 V), as denoted by plots 1211 and 1231, respectively. In a first verify test, which is failed, Vw1_odd and Vw1_even=VvEr1 (plots 1212 and 1232). During the erase pulse 1202 of EV2, Vw1_odd and Vw1_even are set to Ven, as denoted by plots 1213 and 1233, respectively. In the first verify test, which is passed as denoted by Pass1, Vw1_odd and Vw1_even=VvEr1 (plots 1214 and 1234). This triggers the odd-even phase of the erase operation.

During the first erase pulse 1203 of EV3, Vw1_odd is set to Ven (plot 1215) and Vw1_even is set to Vinh (plot 1235). A verify test is not performed between the erase pulses 1203 and 1204. During the second erase pulse 1204 of EV3, Vw1_odd is set to Vinh (plot 1216) and Vw1_even is set to Ven (plot 1236). In a second verify test, which is failed, Vw1_odd and Vw1_even=VvEr2 (plots 1217 and 1237).

During the first erase pulse 1205 of EV4, Vw1_odd is set to Ven (plot 1218) and Vw1_even is set to Vinh (plot 1238). A verify test is not performed between the erase pulses 1205 and 1206.

During the second erase pulse 1206 of EV4, Vw1_odd is set to Vinh (plot 1219) and Vw1_even is set to Ven (plot 1239). In the second verify test, which is passed as denoted by Pass2, Vw1_odd and Vw1_even=VvEr2 (plots 1220 and 1240). This triggers the completion of the erase operation.

A voltage signal 1250 represents a voltage Vsgd/sgs applied to the SGD and SGS transistors of a block. In one approach, this voltage is floated during each erase pulse, as denoted by the dashed line 1251 during the erase pulse 1201, for instance. The voltage may be coupled up to a level such as 12 V as the channel voltage increases. During the verify tests, these transistors are driven to a pass voltage to provide them in a strongly conductive state to allow sensing to occur, as denoted by the plot 1252 during the first verify test of EV1, for instance.

A voltage signal 1260 represents a bit line voltage, Vbl, which can be floated, as denoted by the dashed line 1261 during the erase pulse 1201, for instance. Vbl may also be coupled up as the channel voltage increases. During the verify tests, Vbl is driven to a level such as 0.5 V for sensing to allow a current to flow in the NAND strings, as denoted by the plot 1262 during the first verify test of EV1, for instance.

For the option to charge up the channels using GIDL, the SGD and/or SGS transistors can be driven with a positive voltage such as 8 V while an erase pulse is applied to the bit lines and/or substrate.

EV1 and EV2 are one or more initial erase-verify iterations of an erase operation where all word line erase is used and EV3 and EV4 are one or more additional erase-verify iterations of the erase operation where odd-even word line erase is used.

FIG. 13 depicts example waveforms in an erase operation consistent with FIGS. 11B and 11D. Five erase-verify iterations EV1-EV5 are depicted as an example, where the erase operation is completed after EV5. EV1 and EV2 are an example of one or more successive erase-verify iterations in the all word line phase of an erase operation, where all word line verify is used such as in FIG. 8D, and EV3-EV5 are an example of one or more successive erase-verify iterations in the odd-even word line phase of the erase operation, where an odd-even word line verify process is used such as in FIGS. 8E and 8F.

A voltage signal 1300 represents Verase. Erase pulses 1301, 1302, 1303, 1304, 1305, 1306 and 1307 have magnitudes of Verase1, Verase2, Verase3, Verase3, Verase4, Verase4 and Verase5, respectively.

The voltage signals 1310 and 1330 represent Vwl_odd and Vwl_even, respectively. During the erase pulse 1301 of EV1, Vwl_odd and Vwl_even are set to Ven, as denoted by plots 1311 and 1331, respectively. In a first verify test, which is failed, Vwl_odd and Vwl_even=VvEr1 (plots 1312 and 1332). During the erase pulse 1302 of EV2, Vwl_odd and Vwl_even are set to Ven, as denoted by plots 1313 and 1333, respectively. In the first verify test, which is passed as denoted by Pass1, Vwl_odd and Vwl_even=VvEr1 (plots 1314 and 1334). This triggers the odd-even phase of the erase operation.

During the first erase pulse 1303 of EV3, Vwl_odd is set to Ven (plot 1315) and Vwl_even is set to Vinh (plot 1335). In a second verify test which is performed for the odd-numbered word lines, and which is failed, Vwl_odd=VvEr2 (plot 1316) and Vwl_even=Vread (plot 1336). During the second erase pulse 1304 of EV3, Vwl_odd is set to Vinh (plot 1317) and Vwl_even is set to Ven (plot 1337). In a second verify test which is performed for the even-numbered word lines, and which is failed, Vwl_odd=Vread (plot 1318) and Vwl_even=VvEr2 (plot 1338).

During the first erase pulse 1305 of EV4, Vwl_odd is set to Ven (plot 1319) and Vwl_even is set to Vinh (plot 1339). In a second verify test which is performed for the odd-numbered word lines, and which is passed as denoted by Pass2, Vwl_odd=VvEr2 (plot 1320) and Vwl_even=Vread (plot 1340). During the second erase pulse 1306 of EV4, Vwl_odd is set to Vinh (plot 1321) and Vwl_even is set to Ven (plot 1341). In a second verify test which is performed for the even-numbered word lines, and which is failed, Vwl_odd=Vread (plot 1322) and Vwl_even=VvEr2 (plot 1342).

During the sole erase pulse 1307 of EV5, Vwl_odd is set to Vinh (plot 1323) and Vwl_even is set to Ven (plot 1343). In a second verify test which is performed for the even-numbered word lines, and which is passed as denoted by Pass2, Vwl_odd=Vread (plot 1324) and Vwl_even=VvEr2 (plot 1344).

In this example, the second verify test is passed by the odd-numbered word lines in EV4 and by the even-numbered word lines in EV5, as an example. Thus, an erase-verify iteration in which the memory cells connected to the odd-numbered word lines pass the second verify test can be different than an erase-verify iteration in which the memory cells connected to the even-numbered word lines pass the second verify test. In one approach, a control circuit is configured to inhibit the memory cells connected to the odd-numbered word lines from further erase when the memory cells connected to the odd-numbered word lines pass the second verify test in an erase-verify iteration which is different than an erase-verify iteration in which the memory cells connected to the even-numbered word lines pass the second verify test. Or, the erase-verify iteration in which memory cells connected to the odd-numbered word lines pass the second verify test can be the same erase-verify iteration in which the memory cells connected to the even-numbered word lines pass the second verify test.

A voltage signal 1350 represents a voltage Vsgd/sgs applied to the SGD and SGS transistors of a block. In one approach, this voltage is floated during each erase pulse, as denoted by the dashed line 1351 during the erase pulse 1301, for instance. The voltage may be coupled up to a level such as 12 V as the channel voltage increases. During the verify tests, these transistors are driven to a pass voltage to provide them in a strongly conductive state to allow sensing to occur, as denoted by the plot 1352 during the first verify test of EV1, for instance.

A voltage signal 1360 represents a bit line voltage, Vbl, which can be floated, as denoted by the dashed line 1361 during the erase pulse 1301, for instance. Vbl may also be coupled up as the channel voltage increases. During the verify tests, Vbl is driven to a level such as 0.5 V for sensing to allow a current to flow in the NAND strings, as denoted by the plot 1362 during the first verify test of EV1, for instance.

EV1 and EV2 are one or more initial erase-verify iterations of an erase operation and EV3-EV5 are one or more additional erase-verify iterations of the erase operation.

In one approach which is consistent with FIGS. 12 and 13, the plurality of memory cells are arranged in NAND strings; each NAND string comprises a channel; and a control circuit is configured to charge up the channels by increasing amounts over a set of erase-verify iterations in the first and second phases of the erase operation. For example, the control circuit can be configured to apply an erase voltage to the NAND strings using incremental step pulse erasing.

Accordingly, it can be see that in one implementation, an apparatus comprises: a control circuit configured to connect to a plurality of word lines, the plurality of word lines are connected to a plurality of memory cells, the circuit to perform a plurality of erase-verify iterations for the plurality of memory cells in an erase operation, is configured to: perform an all word line phase of the erase operation in which memory cells connected to each of the word lines are concurrently erased in one or more erase-verify iterations of the plurality of erase-verify iterations until an erase milestone is reached for the plurality of memory cells; and in response to the plurality of memory cells reaching the erase milestone, perform an odd-even word line phase of the erase operation in which memory cells connected to odd-numbered word lines of the plurality of word lines are erased separately from memory cells connected to even-numbered word lines of the plurality of word lines in one or more erase-verify iterations of the plurality of erase-verify iterations.

In another implementation, a method comprises: performing one or more initial erase-verify iterations of an erase operation for a plurality of memory cells until a first verify test is passed by the plurality of memory cells, the first verify test tests threshold voltages of the plurality of memory cells relative to a first voltage, a plurality of word lines are connected to the plurality of memory cells, and each of the one or more initial erase-verify iterations concurrently erases memory cells connected to each of the plurality of word lines; and when the first verify test is passed, performing one or more additional erase-verify iterations of the erase operation for the plurality of memory cells until a second verify test is passed by the plurality of memory cells, the second verify test tests threshold voltages of the plurality of memory cells relative to a second voltage which is lower than the first voltage, and each of the one or more additional erase-verify iterations erases memory cells connected to odd-numbered word lines of the plurality of word lines separately from memory cells connected to even-numbered word lines of the plurality of word lines.

In another implementation, an apparatus comprises: a control circuit configured to connect to a plurality of word lines, the plurality of word lines are connected to a plurality of memory cells, and the circuit, to perform an erase operation for the plurality of memory cells, is configured to: erase the plurality of memory cells in a first phase of the erase operation until threshold voltages of the plurality of memory cells decrease below a first voltage; and in response to the threshold voltages of the plurality of memory cells falling below the first voltage, erase the plurality of memory cells in a second phase of the erase operation until the threshold voltages of the plurality of memory cells decrease below a second voltage which is less than the first voltage, wherein each word line of the plurality of word lines is concurrently biased for erasing in the first phase and odd-numbered word lines of the plurality of word lines are biased for erasing separately from even-numbered word lines of the plurality of word lines in the second phase.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a plurality of word lines, the plurality of word lines are connected to a plurality of memory cells, and the circuit, to perform a plurality of erase-verify iterations for the plurality of memory cells in an erase operation, is configured to:
perform an all word line phase of the erase operation in which memory cells connected to each of the word lines are concurrently erased in one or more erase-verify iterations of the plurality of erase-verify iterations until an erase milestone is reached for the plurality of memory cells; and
in response to the plurality of memory cells reaching the erase milestone, perform an odd-even word line phase of the erase operation in which memory cells connected to odd-numbered word lines of the plurality of word lines are erased separately from memory cells connected to even-numbered word lines of the plurality of word lines in one or more erase-verify iterations of the plurality of erase-verify iterations.

2. The apparatus of claim 1, wherein:
the control circuit is configured to perform a first verify test for the plurality of memory cells during the all word line phase of the erase operation and to perform a second verify test for the plurality of memory cells during the odd-even word line phase of the erase operation;
the first verify test is configured to test threshold voltages of the plurality of memory cells relative to a first voltage; and
the second verify test is configured to test threshold voltages of the plurality of memory cells relative to a second voltage which is lower than the first voltage.

3. The apparatus of claim 2, wherein:
the control circuit is configured to determine that the milestone is reached when the plurality of memory cells pass the first verify test.

4. The apparatus of claim 2, wherein:
the control circuit is configured to perform the first verify test concurrently for the memory cells connected to each of the plurality of word lines during the all word line phase of the erase operation, and to perform the second verify test concurrently for the memory cells connected to each of the plurality of word lines during the odd-even word line phase of the erase operation.

5. The apparatus of claim 2, wherein:
the control circuit is configured to perform the first verify test concurrently for the memory cells connected to each of the plurality of word lines during the all word line phase of the erase operation, and to perform the second verify test for memory cells connected to the odd-numbered word lines separately from memory cells connected to the even-numbered word lines during the odd-even word line phase of the erase operation.

6. The apparatus of claim 5, wherein:
the control circuit is configured to inhibit the memory cells connected to the odd-numbered word lines from further erase when the memory cells connected to the odd-numbered word lines pass the second verify test in an erase-verify iteration which is different than an erase-verify iteration in which the memory cells connected to the even-numbered word lines pass the second verify test.

7. The apparatus of claim 2, wherein:
the control circuit is configured to determine that the erase operation is completed when the plurality of memory cells pass the second verify test.

8. The apparatus of claim 2, wherein:
the control circuit is configured to determine that the milestone is reached when a threshold number of erase-verify iterations have been completed.

9. The apparatus of claim 2, wherein:
the control circuit is configured to adjust the first voltage based on a number of program-erase cycles of the plurality of memory cells; and
the first voltage is a decreasing function of the number of program-erase cycles.

10. The apparatus of claim 2, wherein:
the control circuit is configured to sense a temperature and to adjust the first voltage based on the temperature; and
the first voltage is an increasing function of the temperature.

11. The apparatus of claim 2, wherein:
the control circuit is configured to set the first voltage to be an increasing function of a number of data states to which the plurality of memory cells will be programmed.

12. The apparatus of claim 1, wherein:
the control circuit is on one die and the plurality of memory cells are on another die.

13. A method, comprising:
performing one or more initial erase-verify iterations of an erase operation for a plurality of memory cells until a first verify test is passed by the plurality of memory cells, the first verify test tests threshold voltages of the plurality of memory cells relative to a first voltage, a plurality of word lines are connected to the plurality of memory cells, and each of the one or more initial erase-verify iterations concurrently erases memory cells connected to each of the plurality of word lines; and when the first verify test is passed, performing one or more additional erase-verify iterations of the erase operation for the plurality of memory cells until a second verify test is passed by the plurality of memory cells, the second verify test tests threshold voltages of the plurality of memory cells relative to a second voltage which is lower than the first voltage, and each of the one or more additional erase-verify iterations erases memory cells connected to odd-numbered word lines of the plurality of word lines separately from memory cells connected to even-numbered word lines of the plurality of word lines.

14. The method of claim 13, further comprising:
performing the first verify test concurrently for the memory cells connected to each of the plurality of word lines in each of the one or more initial erase-verify iterations; and
performing the second verify test for memory cells connected to odd-numbered word lines of the plurality of word lines separately from memory cells connected to even-numbered word lines of the plurality of word lines in the one or more additional erase-verify iterations.

15. The method of claim 13, further comprising:
performing the first verify test concurrently for the memory cells connected to each of the plurality of word lines in each of the one or more initial erase-verify iterations; and
performing the second verify test concurrently for the memory cells connected to each of the plurality of word lines in each of the one or more additional erase-verify iterations.

16. An apparatus, comprising:
a control circuit configured to connect to a plurality of word lines, the plurality of word lines are connected to a plurality of memory cells, and the circuit, to perform an erase operation for the plurality of memory cells, is configured to:
  erase the plurality of memory cells in a first phase of the erase operation until threshold voltages of the plurality of memory cells decrease below a first voltage; and
  in response to the threshold voltages of the plurality of memory cells falling below the first voltage, erase the plurality of memory cells in a second phase of the erase operation until the threshold voltages of the plurality of memory cells decrease below a second voltage which is less than the first voltage, wherein each word line of the plurality of word lines is concurrently biased for erasing in the first phase and odd-numbered word lines of the plurality of word lines are biased for erasing separately from even-numbered word lines of the plurality of word lines in the second phase.

17. The apparatus of claim 16, wherein:
the plurality of memory cells are arranged in NAND strings;
each NAND string comprises a channel; and
the control circuit is configured to charge up the channels by increasing amounts over a set of erase-verify iterations in the first and second phases of the erase operation.

18. The apparatus of claim 16, wherein:
the plurality of memory cells are arranged in NAND strings; and
the control circuit is configured to apply an erase voltage to the NAND strings using incremental step pulse erasing.

19. The apparatus of claim 16, wherein:
to bias the odd-numbered word lines for erasing in the second phase, the control circuit is configured to apply an erase-enable voltage to the odd-numbered word lines while applying an erase-inhibit voltage to the even-numbered word lines; and
to bias the even-numbered word lines for erasing in the second phase, the control circuit is configured to apply the erase-enable voltage to the even-numbered word lines while applying the erase-inhibit voltage to the odd-numbered word lines.

20. The apparatus of claim 16, wherein:
the plurality of memory cells are arranged in a sub-block among a plurality of sub-blocks in a block; and
the control circuit is configured to set the first voltage based on a position of the sub-block in the block.

* * * * *